(12) United States Patent
Shiu et al.

(10) Patent No.: US 9,230,927 B2
(45) Date of Patent: Jan. 5, 2016

(54) METHOD OF FABRICATING WAFER-LEVEL CHIP PACKAGE

(71) Applicant: XINTEC INC., Zhongli, Taoyuan County (TW)

(72) Inventors: Chuan-Jin Shiu, Zhongli (TW); Tsang-Yu Liu, Zhubei (TW); Chih-Wei Ho, Zongli (TW); Shih-Hsing Chan, Zhoulan Township (TW); Ching-Jui Chuang, Yangmei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/508,989

(22) Filed: Oct. 7, 2014

(65) Prior Publication Data

US 2015/0099357 A1    Apr. 9, 2015

Related U.S. Application Data

(60) Provisional application No. 61/888,135, filed on Oct. 8, 2013.

(51) Int. Cl.
*H01L 23/00* (2006.01)

(52) U.S. Cl.
CPC ............... *H01L 24/03* (2013.01); *H01L 24/11* (2013.01); *H01L 24/13* (2013.01); *H01L 24/94* (2013.01); *H01L 2224/03009* (2013.01); *H01L 2224/11821* (2013.01); *H01L 2224/13099* (2013.01); *H01L 2924/0105* (2013.01)

(58) Field of Classification Search
None
See application file for complete search history.

(56) References Cited

U.S. PATENT DOCUMENTS

| | | | | |
|---|---|---|---|---|
| 6,781,244 | B2 * | 8/2004 | Prabhu | 257/778 |
| 7,253,519 | B2 | 8/2007 | Huang et al. | |
| 7,399,683 | B2 * | 7/2008 | Noma et al. | 438/465 |
| 7,510,902 | B2 * | 3/2009 | Kang | 438/64 |
| 7,557,017 | B2 * | 7/2009 | Yamada et al. | 438/462 |
| 7,662,670 | B2 * | 2/2010 | Noma et al. | 438/114 |
| 7,728,419 | B2 * | 6/2010 | Lee et al. | 257/690 |
| 7,919,875 | B2 * | 4/2011 | Noma et al. | 257/783 |
| 7,935,568 | B2 * | 5/2011 | Oganesian et al. | 438/106 |
| 8,105,856 | B2 * | 1/2012 | Noma et al. | 438/33 |
| 8,310,036 | B2 * | 11/2012 | Haba et al. | 257/678 |
| 8,598,720 | B2 * | 12/2013 | Tomita et al. | 257/786 |
| 8,791,575 | B2 * | 7/2014 | Oganesian et al. | 257/774 |
| 2003/0230805 | A1 * | 12/2003 | Noma et al. | 257/737 |
| 2012/0181672 | A1 | 7/2012 | Lou et al. | |

FOREIGN PATENT DOCUMENTS

WO    2012/061114    5/2012

* cited by examiner

*Primary Examiner* — Scott B Geyer
(74) *Attorney, Agent, or Firm* — Liu & Liu

(57) ABSTRACT

A method of fabricating a wafer-level chip package is provided. First, a wafer with two adjacent chips is provided, the wafer having an upper surface and a lower surface, and one side of each chip includes a conducting pad on the lower surface. A recess and an isolation layer extend from the upper surface to the lower surface, which the recess exposes the conducting pad. A part of the isolation layer is disposed in the recess with an opening to expose the conducting pad. A conductive layer is formed on the isolation layer and the conductive pad, and a photo-resist layer is spray coated on the conductive layer. The photo-resist layer is exposed and developed to expose the conductive layer, and the conductive layer is etched to form a redistribution layer. After stripping the photo-resist layer, a solder layer is formed on the isolation layer and the redistribution layer.

17 Claims, 16 Drawing Sheets

METHOD OF FABRICATING WAFER-LEVEL CHIP PACKAGE

RELATED APPLICATIONS

This application claims priority to U.S. provisional Application Ser. No. 61/888,135, filed Oct. 8, 2013, which is herein incorporated by reference.

BACKGROUND

1. Field of Invention

The present invention relates to a method for fabricating a package. More particularly, the present invention relates to a method for fabricating a wafer-level chip package.

2. Description of Related Art

Along with the trends of electronic devices toward lighter and more compact, the semiconductor chip corresponding to the electronic device has a reduced size and increased wiring density. Therefore, it is more difficult and challenging to fabricate a semiconductor chip package in the subsequent process for the semiconductor chip. Wafer-level chip package is a method of packaging the semiconductor chip, which the method means all the chips are packaged and tested after completion of manufacturing these chips on the wafer, and then the wafer is cut into single chip packages. Since the size of the semiconductor chip is decreased and the functional density on the semiconductor chip is increased, the wiring density of the redistribution layer on the semiconductor chip should be increased correspondingly. Generally, a complicated electro-deposited photoresist technique is applied to complete the lithography process of the high-density redistribution layer. However, the process often leaves metal residues on sides of the chip package, which brings in defects and thus water infiltration to the packaged product. Accordingly, a more reliable electronic device package and a fabrication method thereof, which is more suitable for mass production, have become one of important issues in electronics industry.

SUMMARY

The present disclosure provides a method for fabricating a wafer-level chip package. The method effectively prevent metal residues remained between the chip packages on the wafer during the fabricating process, and thus enhances reliability of the conductive paths in each chip package. Also, the method has simpler steps to decrease the manufacturing cost of the chip package.

The present disclosure provides method of fabricating a wafer-level chip package. The method includes providing a wafer with at least two adjacent chips, the wafer having an upper surface and a lower surface, and at least one side of each chip includes a conducting pad on the lower surface. A recess is formed to extend from the upper surface to the lower surface to expose the conducting pad, and an isolation layer is formed to extend from the upper surface to the lower surface, a part of the isolation layer disposed in the recess, which the isolation layer has an opening to expose the conducting pad. A conductive layer is formed on the isolation layer and the conductive pad, and a photo-resist layer is spray coated on the conductive layer. The photo-resist layer is exposed and developed to expose a part of the conductive layer, and the part of the conductive layer is etched to form a redistribution layer. The photo-resist layer is stripped, and a solder layer is formed on the isolation layer and the redistribution layer.

In various embodiments of the present disclosure, before spray coating a photo-resist layer on the conductive layer, the method further includes forming an adhesive layer on the conductive layer.

In various embodiments of the present disclosure, the adhesive layer is formed by spin coating.

In various embodiments of the present disclosure, the method further includes forming a solder ball on the conducting pad, which a part of the redistribution layer is interposed between the solder ball and the conducting pad.

In various embodiments of the present disclosure, the solder ball is formed of tin.

In various embodiments of the present disclosure, after stripping the photo-resist layer, the method further includes forming an interfacial layer on the part of the redistribution layer, in which a part of the interfacial layer is interposed between the solder ball and the part of the redistribution layer.

In various embodiments of the present disclosure, the conductive layer and the interfacial layer are formed by sputtering.

In various embodiments of the present disclosure, the interfacial layer is formed of nickel.

In various embodiments of the present disclosure, the conductive layer is formed of aluminum.

In various embodiments of the present disclosure, the method of stripping the photo-resist layer is by spin coating a solvent for the photo-resist layer on the photo-resist layer to dissolve and remove the photo-resist layer.

In various embodiments of the present disclosure, the solvent is acetone.

In various embodiments of the present disclosure, the method further includes cutting at least the two adjacent chips along a scribe line, wherein the scribe line is between at least the two adjacent chips.

In various embodiments of the present disclosure, the photo-resist layer is a positive type resist.

In various embodiments of the present disclosure, the isolation layer has two openings.

In various embodiments of the present disclosure, a lower surface of the recess is lower than a sidewall of the conducting pad during the method of forming a recess extending from the upper surface to the lower surface.

In various embodiments of the present disclosure, the isolation layer covers an upper surface of the conducting pad to expose the sidewall of the conducting pad during the method of forming a recess extending from the upper surface to the lower surface.

In various embodiments of the present disclosure, during forming a recess extending from the upper surface to the lower surface, the method further includes forming two conducting recesses and a scribe recess between the two conducting recesses, in which the conducting recesses exposes the conducting pad.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
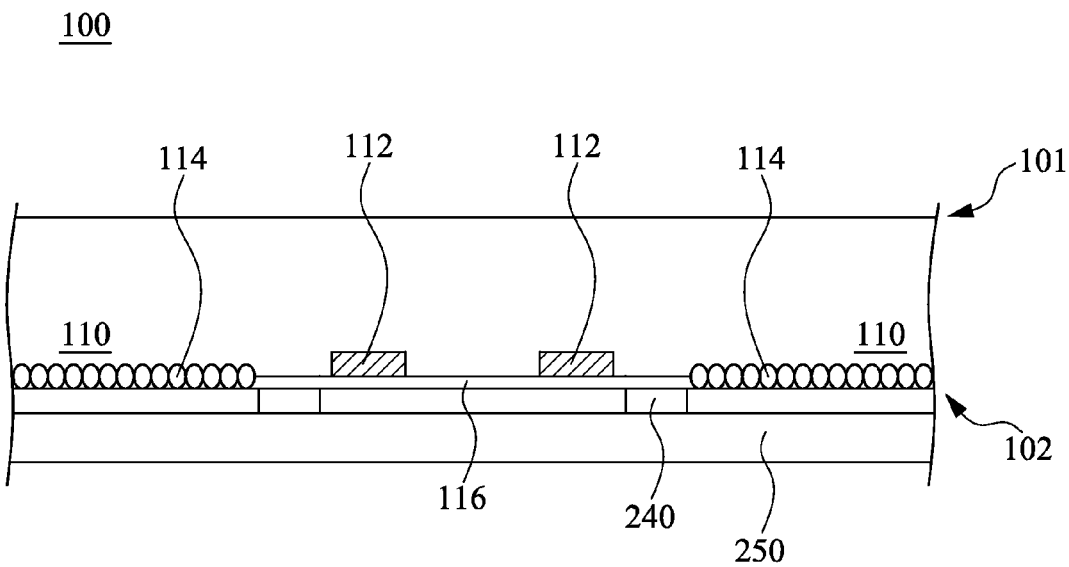
FIG. 1 is a cross-sectional view in a first stage of the method according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1-12 are cross-sectional views of different stages of the fabricating method according to various embodiments of the present disclosure. FIG. 1 is a cross-sectional view in a first stage of the fabricating method according to various embodiments of the present disclosure. First, a wafer 100 is provided including at least two adjacent chips 110, and the wafer 100 has an upper surface 101 and a lower surface 102. At least one side of each chip 110 includes a conducting pad 112 on the lower surface 102. The wafer 100 could include, but not limited to silicon, germanium, or other III-V group elements. As shown in FIG. 1, the wafer 100 includes two chips 110 adjacent aligned, and a side edge of each chip 110 includes the conducting pad 112 on the lower surface 102 of the wafer 100. In embodiments, the conducting pad 112 could be connected to a solder ball or a wire-bonding after packaging each chip 110. The conducting pad 112 may be formed of aluminum, copper, nickel, or other suitable metal materials. The chip 110 further includes an electronic component 114 and an interconnection structure (not shown) electrically connected to the electronic component 114. The electronic component 114 could include, but not limited to active elements, passive elements, electronic components of integrated circuits, such as digital circuits or analog circuits, opto electronic devices, micro electro mechanical systems (MEMS), micro fluidic systems, physical sensors of measuring physical quantity variation, such as heat, light and pressure, RF circuits, accelerators, gyroscopes, micro actuators, surface acoustic wave (SAW) device, pressure sensors. Further, the wafer 100 includes a passivation layer 116, a support body 240 and a carrier substrate 250 under the lower surface 102 of the wafer 100. The passivation layer 116 is capable of isolating the air and providing stress-buffering to protect every component in the chip 110. The passivation layer 116 could be, but not limited to silicon oxide, silicon nitride, silicon oxynitride, or other suitable isolation materials. The carrier substrate 250 is disposed under the under surface 102 of the wafer 100 by the support body 240, and thus a cavity is formed under each chip 110 to provide protection to every component in the chip 110. Also, the carrier substrate 250 provides the wafer 100 carrying capacity required in subsequent processes.

Figure 2:
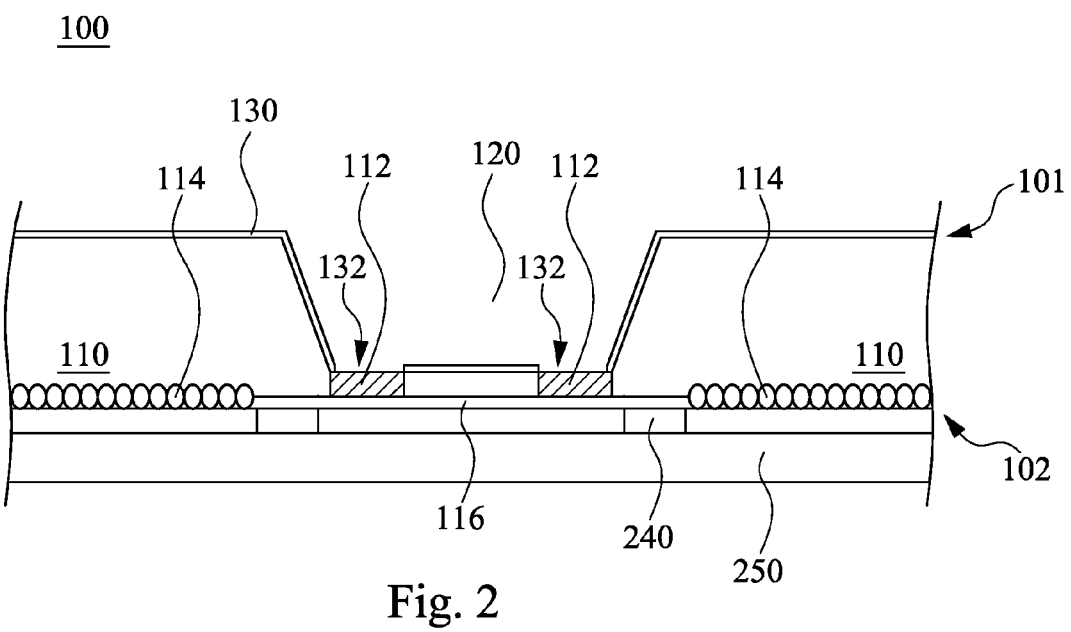
FIG. 2 is a cross-sectional view in a second stage of the method according to various embodiments of the present disclosure.

Please refer to FIG. 2, FIG. 2 is a cross-sectional view in a second stage of the fabricating method according to various embodiments of the present disclosure. A recess 120 extending from the upper surface 101 to the lower surface 102 is formed to expose the conducting pad 112. The recess 120 is formed between the two adjacent chips 110 and acts as the pre-cutting of the two adjacent chips 110. The recess 120 is formed by, but not limited to photolithography. As aforementioned, the conducting pad 112 could be connected to a solder ball or a wire-bonding after packaging each chip 110. Therefore, an end point of etching the wafer 100 for forming the recess 120 could be set to respectively expose the conducting pads 112 of the two adjacent pads 100. Continuing in FIG. 2, an isolation layer 130 extending from the upper surface 101 to the lower surface 102, and a part of the isolation layer 130 is disposed in the recess 120. The isolation layer 130 has at least two openings 132 to expose the conducting pad. The isolation layer 130 could be silicon oxide, silicon nitride, silicon oxynitride, or other suitable isolation materials. A chemical vapor deposition (CVD) is applied to form the isolation layer 130 conformally along the upper surface 101 of the wafer 100, sidewalls and a bottom of the recess 120. Final, using photolithography technique to form the opening 132 corresponding to each conducting pad 112 to expose the conducting pad 112.

Figure 3:
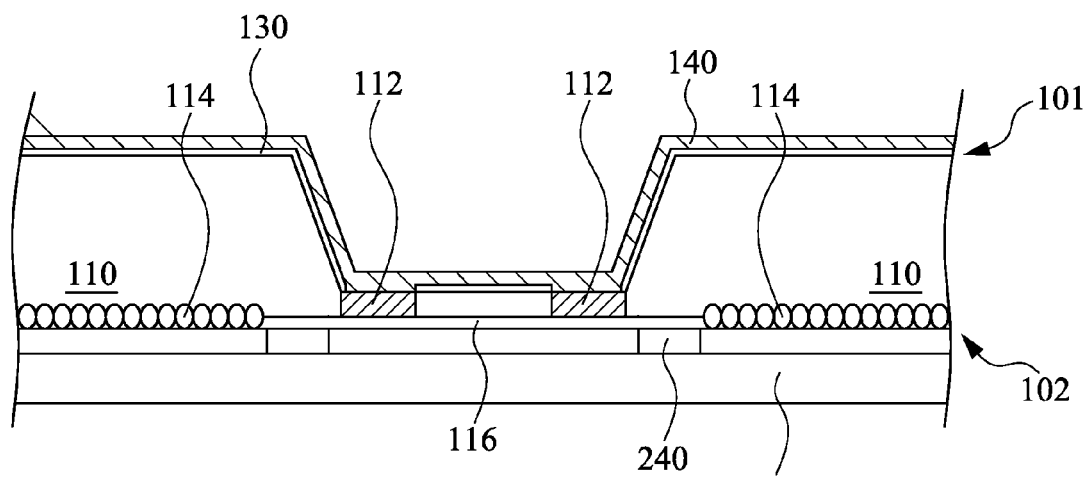
FIG. 3 is a cross-sectional view in a third stage of the method according to various embodiments of the present disclosure.

Continuing to FIG. 3, FIG. 3 is a cross-sectional view in a third stage of the fabricating method according to various embodiments of the present disclosure. A conductive layer 140 is formed on the isolation layer 130 and the conductive pad 112. The conducting layer 140 may be formed of aluminum, copper, nickel, or other suitable metal materials, using sputtering, evaporation, or other suitable process to deposit the conductive layer 140 on the isolation layer 130. In embodiments, the conductive layer 140 is formed of aluminum.

Figure 4:
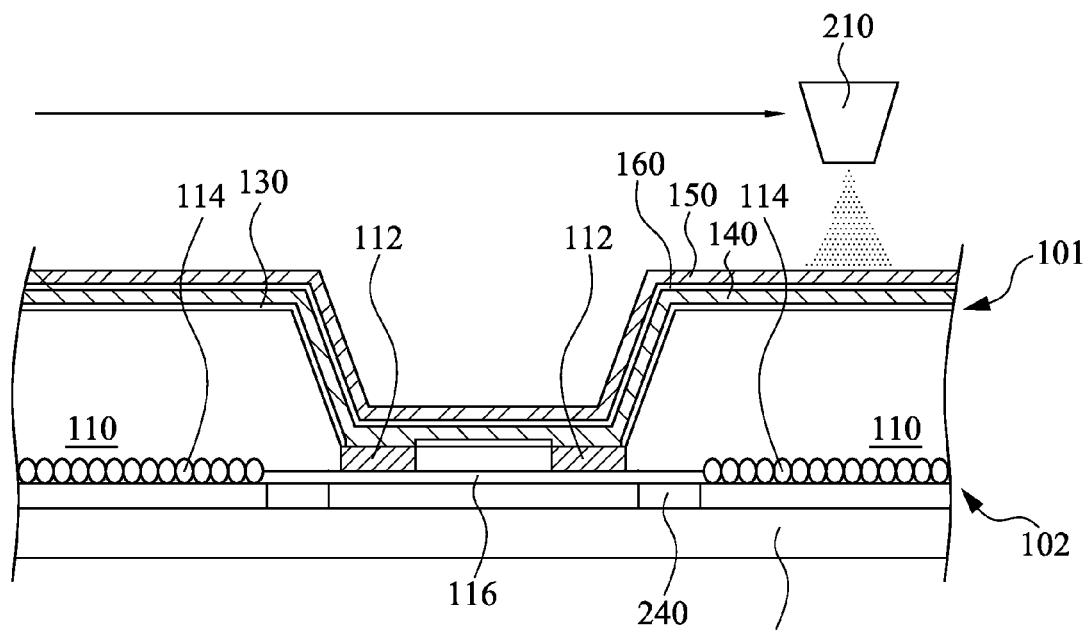
FIG. 4 is a cross-sectional view in a fourth stage of the method according to various embodiments of the present disclosure.

Please refer to FIG. 4, FIG. 4 is a cross-sectional view in a fourth stage of the fabricating method according to various embodiments of the present disclosure. A photo-resist layer 150 is spray coated on the conductive layer 140. The way of spray-coating the photo-resist layer 150 on the conductive layer 140 is shown in FIG. 4, a nozzle 210 is applied to evenly spray the photo-resist on the upper surface 101 of the wafer 100, and the photo-resist layer 150 having uniform thickness is formed. It is worth noting that, general method of forming the electro-deposited photoresist is necessary to pre-clean the conductive layer 140. Oxides and impurities on the surface of the conductive layer 140 should be removed to ensure the surface of the conductive layer 140 having good and uniform conductivity, and thus the photo-resist could be electro-deposited on the conductive layer 140 in subsequent electrify process. In contrast to the present embodiments, it is not necessary to pre-clean the conductive layer 140 before spray-coating the photo-resist for forming the photo-resist layer 150. The method decreases the possibility of the cleaning fluid causing the defect on the conductive layer 140 during the pre-clean process, to prevent the broken lines formed on the redistribution metal from the conductive layer 140. Besides, there are many inconveniences in the electro-deposited photoresist process. For example, the complexity of the electro-deposited photoresist process limits the development of the machine automatic design, resulting in a number of steps must be carried out manually. Relatively, spray-coating process has much simpler steps and higher degree of automation, therefore, the spray coating process saves more operating costs for manpower than the electro-deposited photoresist process. Continuing in FIG. 4, in order to enhance the adhesion between the photo-resist and the conductive layer 140 during the spray-coating photoresist process, in some embodiments, an adhesive layer 160 is formed on the conductive layer 140 before spray-coating the photo-resist layer 150 on the conductive layer 140. Then, the photo-resist layer 150 is spray coated, and the adhesive layer 160 is interposed between the photo-resist layer 150 and the conductive layer 140. The material and the thickness of the adhesive layer 160 could be determined without prejudice to the subsequent exposing, developing and etching process. The adhesive layer 160 assists the photo-resist layer 150 to favorably form a conformal film on the conductive layer 140, and a process margin of the subsequent exposing, developing and etching process is increased. The conductive layer 140 is formed by, but not limited to spin coating.

Figure 5:
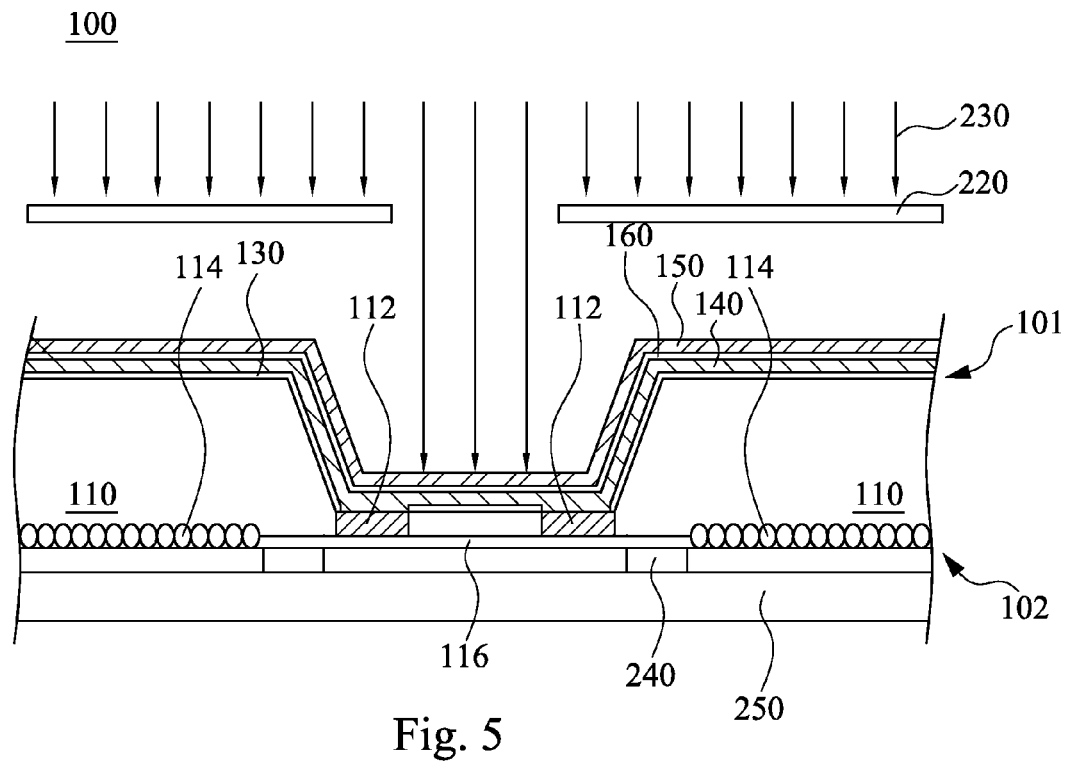
FIG. 5 is a cross-sectional view in a fifth stage of the method according to various embodiments of the present disclosure.
Figure 6:
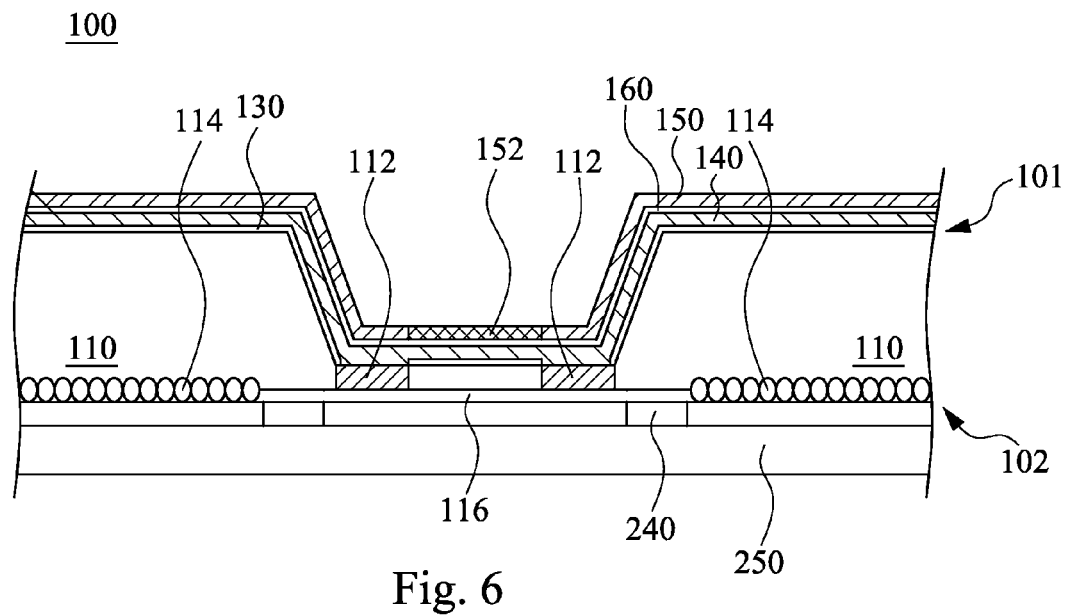
FIG. 6 is a cross-sectional view in a sixth stage of the method according to various embodiments of the present disclosure.
Figure 7:
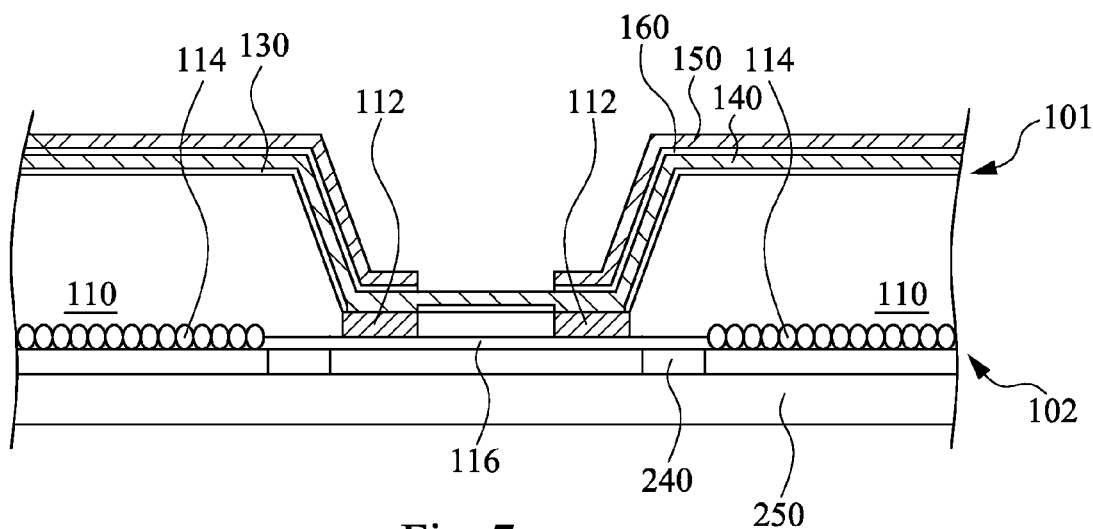
FIG. 7 is a cross-sectional view in a seventh stage of the method according to various embodiments of the present disclosure.

Please refer to FIG. 5-7, FIG. 5 is a cross-sectional view in a fifth stage of the fabricating method according to various embodiments of the present disclosure, FIG. 6 is a cross-sectional view in a sixth stage of the fabricating method according to various embodiments of the present disclosure, and FIG. 7 is a cross-sectional view in a seventh stage of the fabricating method according to various embodiments of the present disclosure. After spray coating the photo-resist layer 150 on the conductive layer 140, the photo-resist layer 150 is exposed. As shown in FIG. 5, the way of exposing the photo-resist layer 150, such as applying a specific patterned mask 220 and ultraviolet light 220 with appropriate wavelength to expose the photo-resist layer 150. It is worth noting that, the photo-resist layer 150 in various embodiments of the present disclosure is a positive type resist. As shown in FIG. 6, a part of the photo-resist layer 150 is exposed and transfers to an exposed photo-resist 152. Continuing in FIG. 7, the exposed photo-resist 152 will be washed away in the subsequent developing process, remaining another unexposed part of the photo-resist layer 150. In other words, the developed photo-resist layer 150 exposes at least a part of the conductive layer 140. More specifically, the specific pattern formed by the mask 220 shielding the ultraviolet light 230 would become the other unexposed part of the photo-resist layer 150 and remain thereafter. It is worth mentioning that, in the exposing and developing step, the photo-resist layer 150 in the recess 120 is exposed and developed to expose the conductive layer 140 between the two chips 110, and the exposed conductive layer 140 between the two chips 110 may be further etched to cut the conduction path between the two chips 110. On the other hand, when a negative type resist material is used as the photo-resist layer 150, the photo-resist layer 150 in the recess 120 needs to be shielded by a mask and is not exposed, and can only be washed away in the subsequent development process. However, in actual operation, the exposure scattered ultraviolet light from the higher grounds on both sides of the recess 120 will incident into the recess 120, causing the negative type resist material in the recess 120 to be exposed and remain behind, resulting in the subsequent etching process fail to clean the conductive layer 140 between the two adjacent chips 110 thoroughly. Therefore, metal residues will remain on the outer surfaces of each chip, and water vapor may subsequently infiltrate into the metal conductive lines in the chip and cause corrosion and other problems. In contrast, an embodiment of the present disclosure applies a positive type resist as the photo-resist layer 150, the photo-resist layer 150 in the recess 120 is the region scheduled to undergo exposure and washed away in the subsequent developing process, this will directly avoid the problems that may occur when using a negative type resist.

Figure 8:
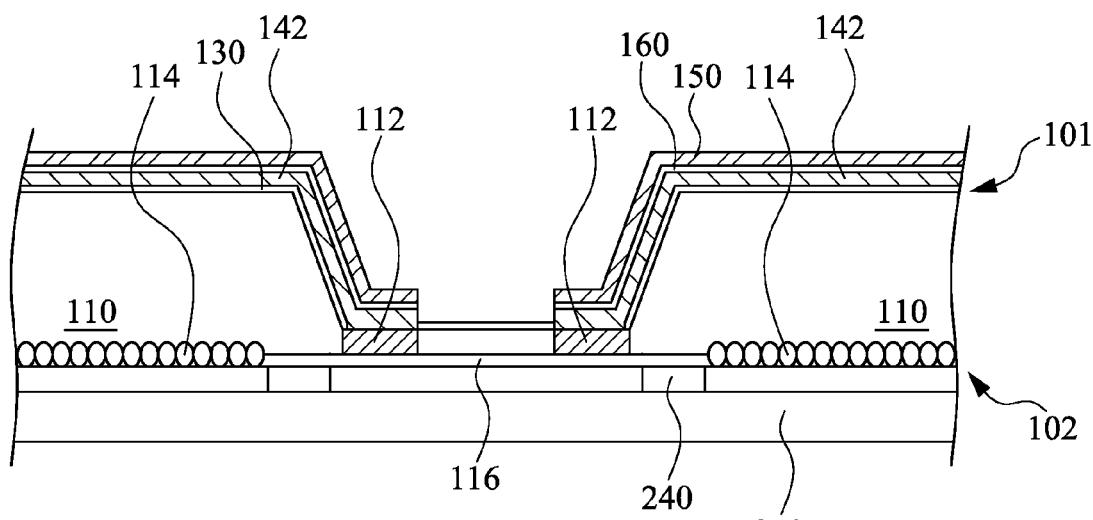
FIG. 8 is a cross-sectional view in an eighth stage of the method according to various embodiments of the present disclosure.

Please refer to FIG. 8, FIG. 8 is a cross-sectional view in an eighth stage of the fabricating method according to various embodiments of the present disclosure. After a part of the conductive layer 140 is exposed by exposing and developing a part of the photo-resist layer 150, the conductive layer 140 is etched to form a redistribution layer 142. The etching method could be, for example, a dry etching, but not limited thereto. Accordingly, the other part of the conductive layer 140 that is shielded by the other part of the photo-resist layer 150 left behind is not etched, and the redistribution layer 142 for each chip 110 is formed. The redistribution layer 142 is used as the electrical connection between the electronic components 114 in the chip 110 and the conductive pad 112 around the chip 110.

Figure 9:
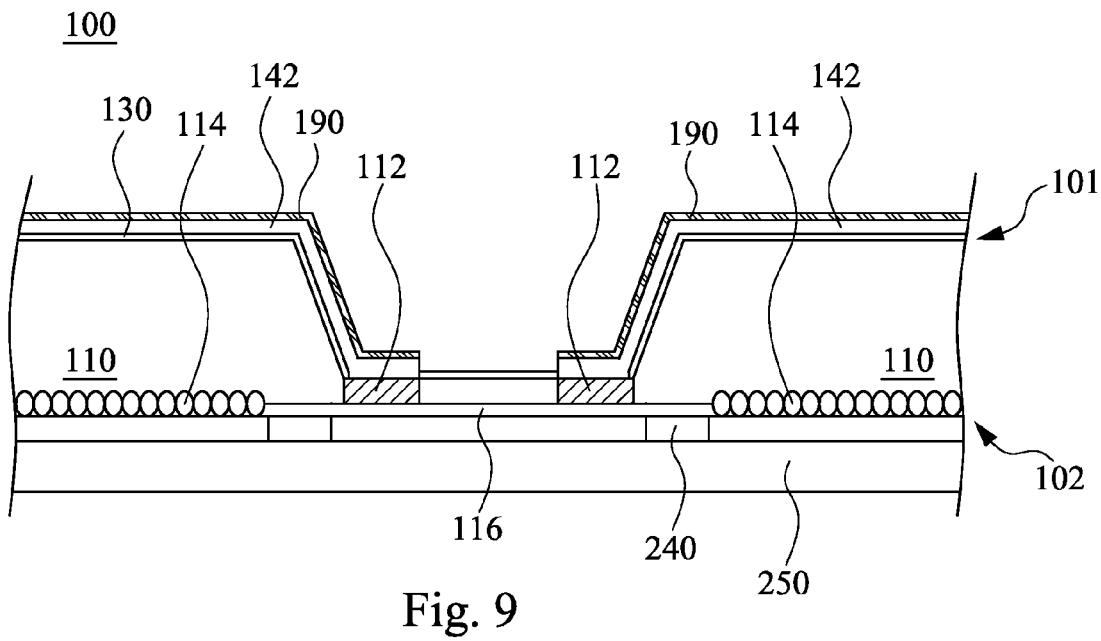
FIG. 9 is a cross-sectional view in a ninth stage of the method according to various embodiments of the present disclosure.

Please refer to FIG. 9, FIG. 9 is a cross-sectional view in a ninth stage of the fabricating method according to various embodiments of the present disclosure. After etching a part of the conductive layer 140 to form the redistribution layer 142, the photo-resist layer 150 is stripped. The method of stripping the photo-resist layer 150 could be appropriately adjusted for different photoresist materials. In embodiments, the method of stripping the photo-resist layer 150 is by spin coating a solvent for the photo-resist layer 150 onto the photo-resist layer 150 to dissolve and clean the photo-resist layer 150. In other words, spin coating the solvent for the photo-resist layer 150 onto the photo-resist layer 150 to dissolve the photo-resist layer 150 in the solvent, and then use processes such as rotating centrifugal drying or air knife to clean the dissolved photoresist. The solvent could be any solvent which dissolve the photo-resist layer 150, or both the photo-resist layer 150 and the adhesion layer 160, but not dissolve the conductive layer 140, for example, but not limited thereto, acetone. As shown in FIG. 9, in embodiments of the present disclosure, after stripping the photo-resist layer 150, the method further includes forming an interfacial layer 190 on the conductive layer 140. The interfacial layer 190 is interposed between the subsequently formed solder balls, and a part of the redistribution layer 142 acts as an intermediate bonding layer to strengthen the bonding strength between the subsequently formed solder balls and the redistribution layer 142. The interfacial layer 190 could be any suitable conducting material, such as nickel, which is fully deposited onto the conductive layer 140 by sputtering. And then, a desired pattern is formed by lithography, the method is however not limited thereto.

Figure 10:
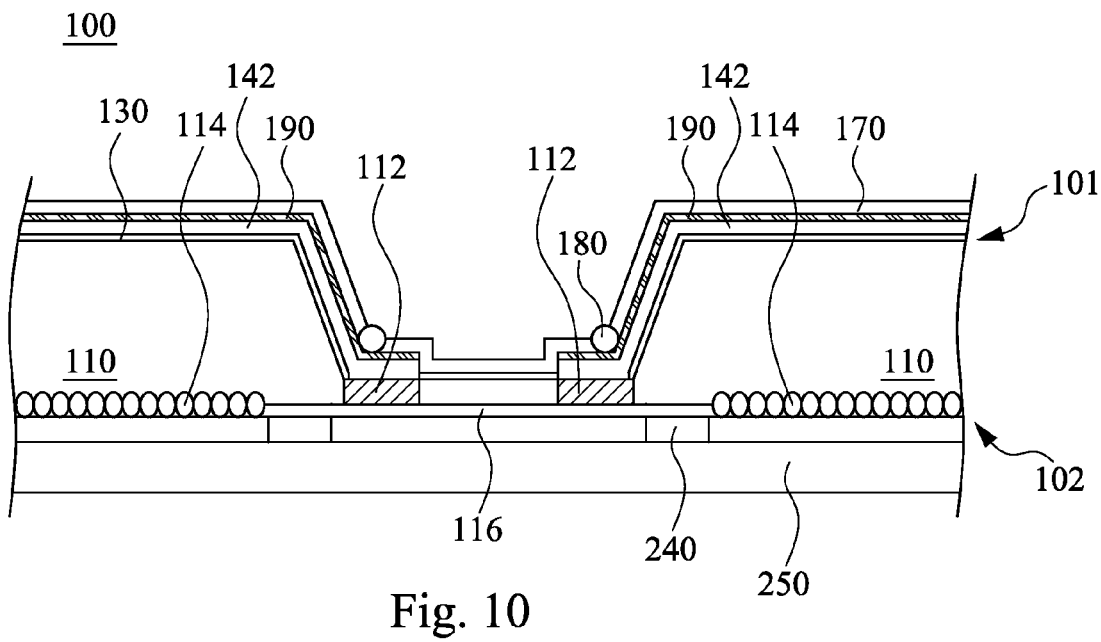
FIG. 10 is a cross-sectional view in a tenth stage of the method according to various embodiments of the present disclosure.

Please refer to FIG. 10, FIG. 10 is a cross-sectional view in a tenth stage of the fabricating method according to various embodiments of the present disclosure. After stripping the photo-resist layer 150, a solder layer 170 is formed fully over the isolation layer 130 and the redistribution layer 142 to cover and protect the redistribution layer 142 formed on the chip 110. The solder layer 170, for example, may be formed by brush coating a solder mask onto the surface of the isolation layer 130 and the redistribution layer 142, but not limited thereto. Thereafter, solder lines are wire-bonded or solder balls are formed on the conducting pad 112 to further connect the printed circuit board, and thus the chip 110 transmits input or output signals through the solder lines or solder balls between printed circuit boards and the conducting pad 112. The wire-bonded solder lines or solder balls are also connected to other semiconductor chips or other semiconductor interposers, and the chip 110 will integrate with other semiconductor chips or other semiconductor interposers to form a 3D-IC stacking structure. In embodiments, the method further includes forming a solder ball 180 on the conducting pad 112, which a part of the redistribution layer 142 is interposed between the solder ball 180 and the conducting pad 112. In some embodiments, at least a part of the interfacial layer 190 is interposed between the solder ball 180 and a part of the redistribution layer 142. The interfacial layer 190 is applied to strengthen the bonding strength between the solder ball 180 and the redistribution layer 142, and the reliability of the chip package could be enhanced.

Figure 11:
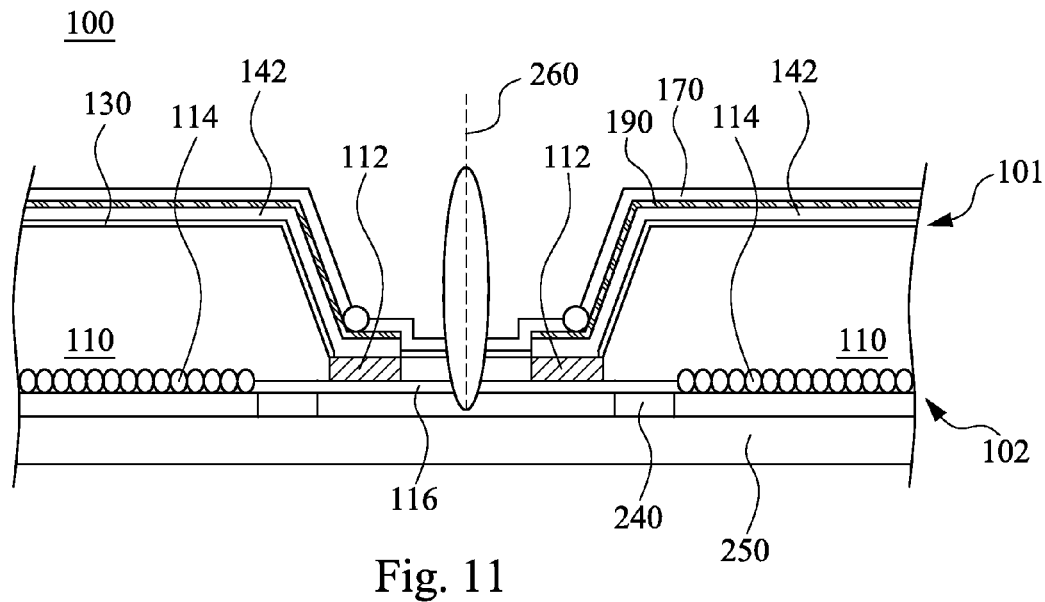
FIG. 11 is a cross-sectional view in an eleventh stage of the method according to various embodiments of the present disclosure.
Figure 12:
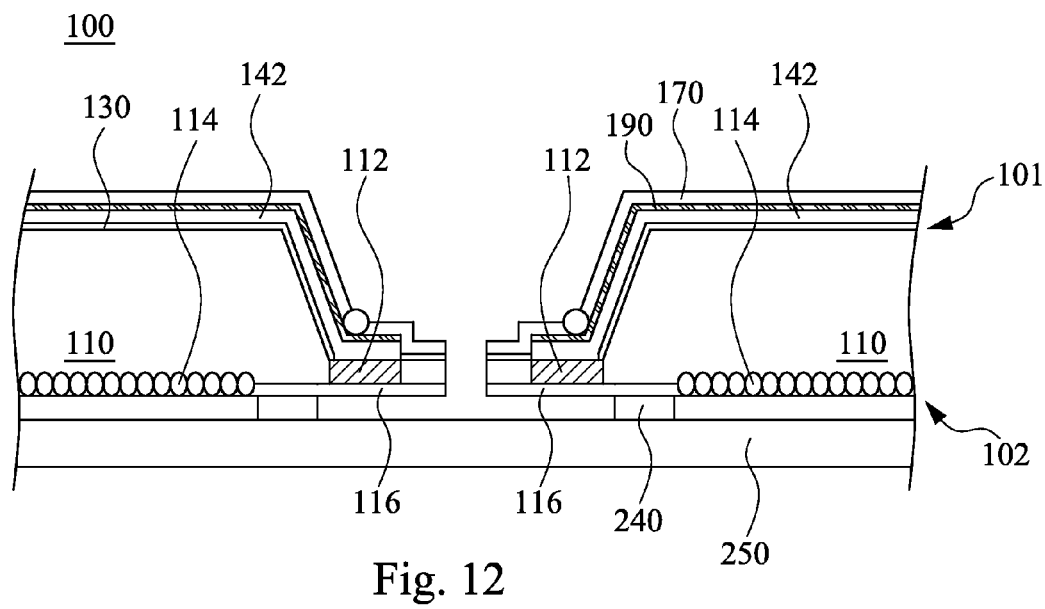
FIG. 12 is a cross-sectional view in a twelfth stage of the method according to various embodiments of the present disclosure.

Please refer to FIGS. 11 and 12, FIGS. 11 and 12 are respectively cross-sectional views of the last two stages of the fabricating method according to various embodiments of the present disclosure. In embodiments, the two adjacent chips 110 are split along a scribe line 260 after forming the solder layer 170 fully over the isolation layer 130 and the redistribution layer 142, which the scribe line 260 is positioned between the two adjacent chips 110. The scribe line 260 is, for example, shown in FIG. 11, only the two adjacent chips 110 are split. The carrier substrate 250 is not split, so that each split chip 110 will still be temporary arranged on the same carrier substrate 250 after packaging to allow ease of transporting, as shown in FIG. 12, but not limited thereto. The scribe line 260 could also split through the carrier substrate 250, and each split chip 110 is arranged on a part of the carrier substrate 250 after packaging to provide a protection for the internal components.

Figure 13:
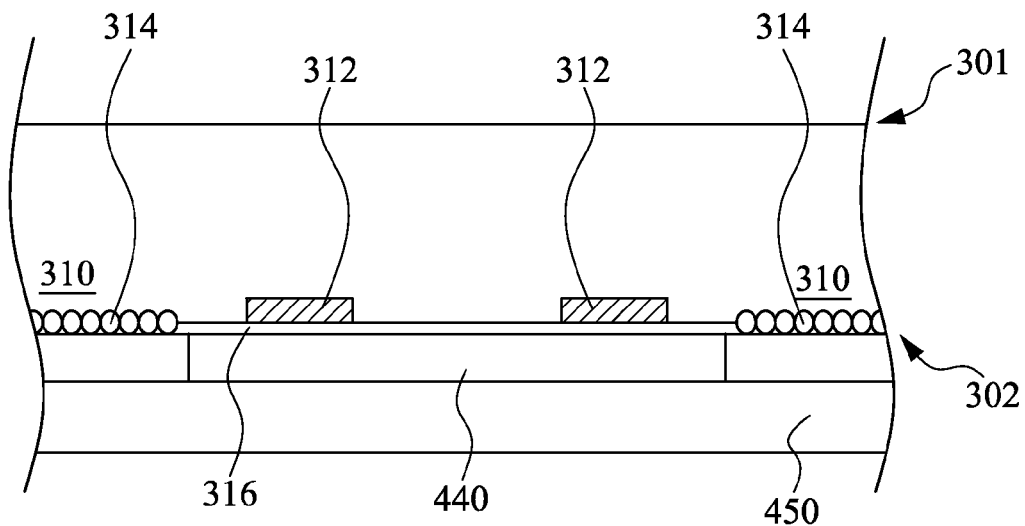
FIG. 13 is a cross-sectional view in a first stage of the method according to various embodiments of the present disclosure.

FIGS. 13-22 are cross-sectional views of different stages of the fabricating method according to various embodiments of the present disclosure. The major difference is, different recesses and isolation layers are formed in FIGS. 1-12 and FIGS. 13-22, respectively. Please refer to FIG. 13, FIG. 13 is a cross-sectional view in a first stage of the fabricating method according to various embodiments of the present disclosure. First, a wafer 300 is provided including at least two adjacent chips 310, and the wafer 300 has an upper surface 301 and a lower surface 302. At least one side of each chip 310 includes a conducting pad 312 on the lower surface 302. The wafer 300 could include, but not limited to silicon, germanium, or other III-V group elements. In embodiments, the conducting pad 312 could be connected to a solder ball or a wire-bonding after packaging each chip 310. The conducting pad 312 may be formed of aluminum, copper, nickel, or other suitable metal materials. The chip 310 further includes an electronic component 314 and an interconnection structure (not shown) electrically connected to the electronic component 314. The electronic component 314 could include, but not limited to active elements, passive elements, electronic components of integrated circuits, such as digital circuits or analog circuits, opto electronic devices, micro electro mechanical systems (MEMS), micro fluidic systems, physical sensors of measuring physical quantity variation, such as heat, light and pressure, RF circuits, accelerators, gyroscopes, micro actuators, surface acoustic wave (SAW) device, pressure sensors. Further, the wafer 300 includes a passivation layer 316, a support body 440 and a carrier substrate 450 under the lower surface 302 of the wafer 300. The passivation layer 316 is capable of isolating the air and providing stress-buffering to protect every component in the chip 310. The passivation layer 316 could be, but not limited to silicon oxide, silicon nitride, silicon oxynitride, or other suitable isolation materials. The carrier substrate 450 is disposed under the under surface 302 of the wafer 300 by the support body 440, and thus a cavity is formed under each chip 310 to provide protection to every components in the chip 310. Also, the carrier substrate 450 provides the wafer 300 carrying capacity required in subsequent process.

Figure 14:
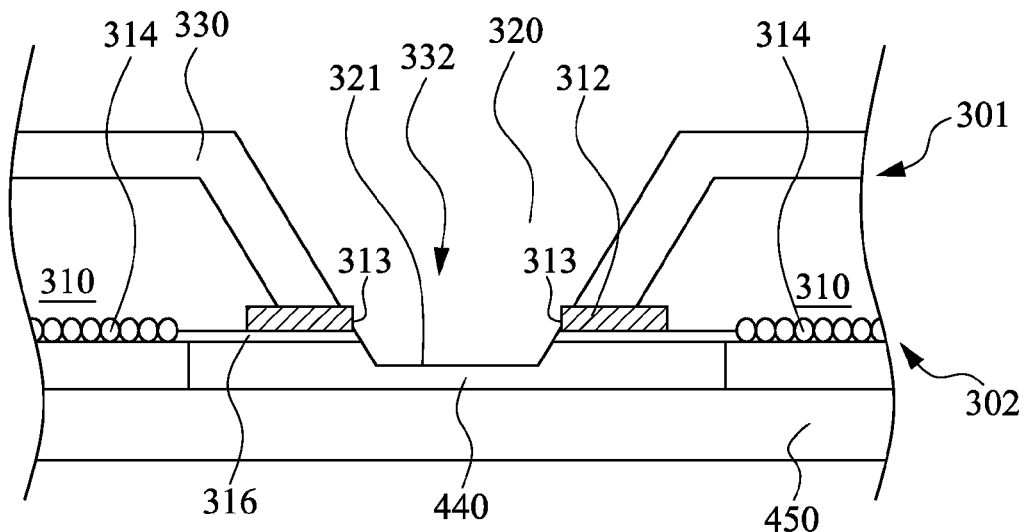
FIG. 14 is a cross-sectional view in a second stage of the method according to various embodiments of the present disclosure.

Please refer to FIG. 14, FIG. 14 is a cross-sectional view in a second stage of the fabricating method according to various embodiments of the present disclosure. A recess 320 extending from the upper surface 301 to the lower surface 302 is formed to expose the conducting pad 312. The recess 320 is formed between the two adjacent chips 310 and acts as the pre-cutting of the two adjacent chips 310. The recess 320 is formed by, but not limited to photolithography. As aforementioned, the conducting pad 312 could be connected to a solder ball or a wire-bonding after packaging each chip 310. Therefore, an end point of etching the wafer 300 for forming the recess 320 could be set to respectively expose the conducting pads 312 of the two adjacent chips 310. In embodiments, after etching the recess 320 to expose a part of a upper surface of the conducting pads 312, the method further includes etching downward through a middle of the two conducting pads 312 to expose a sidewall 313 of the conducting pads 312. In some embodiments, the recess 320 crosses the passivation layer 316 and etches to the support body 440, and a lower surface 321 of the recess 320 is lower than a sidewall 313 of the conducting pad 312. Continuing in FIG. 14, an isolation layer 330 extending from the upper surface 301 to the lower surface 302, and a part of the isolation layer 330 is disposed in the recess 320. The isolation layer 330 has an opening 332 to expose the conducting pad 312. In embodiments, the isolation layer 330 is extended to a upper surface of the conducting pad 312, and the opening 332 exposes a part of the upper surface of the conducting pad 312, the sidewall 313 of the conducting pad 312 and the lower surface 321 of the recess 320. The isolation layer 330 could be silicon oxide, silicon nitride, silicon oxynitride, or other suitable isolation materials. A chemical vapor deposition (CVD) is applied to form the isolation layer 330 conformally from the upper surface 301 of the wafer 300 and the sidewall of the recess 320 to the lower surface 321 of the recess 320. Final, a photolithography process is applied to form the opening 332 corresponding to the sidewall 313 of each conducting pad 312 and the lower surface 321 of the recess 320 to expose the sidewall 313 of each conducting pad 312.

Figure 15:
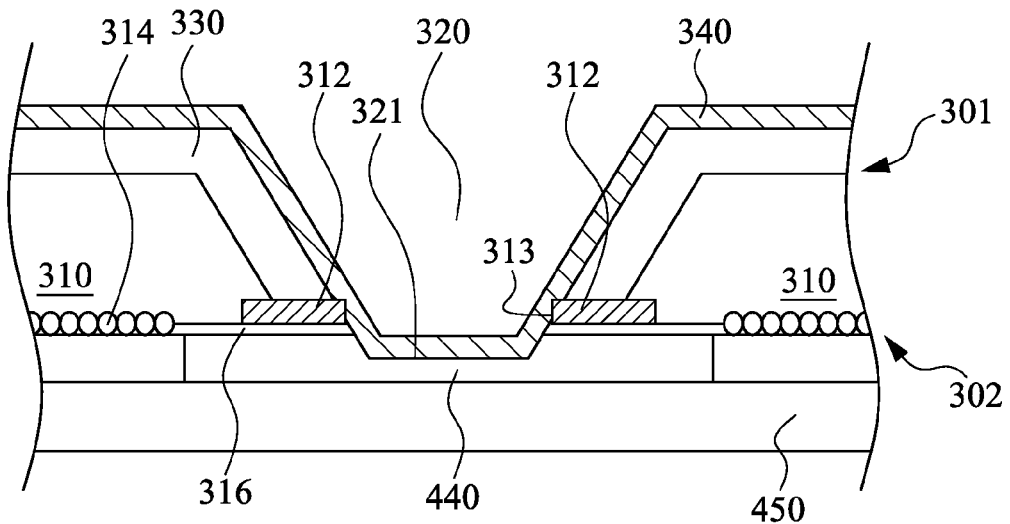
FIG. 15 is a cross-sectional view in a third stage of the method according to various embodiments of the present disclosure.

Continuing to FIG. 15, FIG. 15 is a cross-sectional view in a third stage of the fabricating method according to various embodiments of the present disclosure. A conductive layer 340 is formed on the isolation layer 330, the conducting pad 312 and the lower surface 321 of the recess 320, and the conductive layer 340 is in contact with the sidewall 313 of the conducting pad 312. The conducting layer 340 may be formed of aluminum, copper, nickel, or other suitable metal materials, using sputtering, evaporation, or other suitable process to deposit the conductive layer 340 on the semiconductor wafer. In embodiments, the conductive layer is formed of aluminum.

Figure 16:
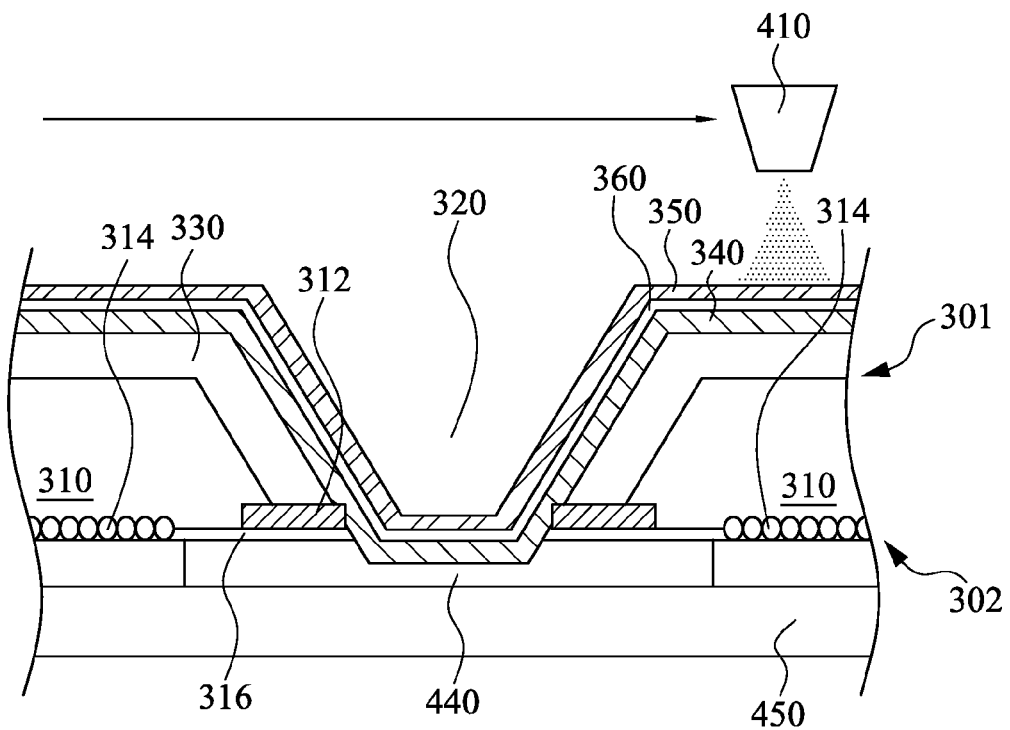
FIG. 16 is a cross-sectional view in a fourth stage of the method according to various embodiments of the present disclosure.

Please refer to FIG. 16, FIG. 16 is a cross-sectional view in a fourth stage of the fabricating method according to various embodiments of the present disclosure. A photo-resist layer 350 is spray coated on the conductive layer 340. The way of spray coating the photo-resist layer 350 on the conductive layer 340 is shown in FIG. 16, a nozzle 410 is applied to evenly spray the photoresist on the upper surface 301 of the wafer 300, and the photo-resist layer 350 having uniform thickness is formed. As show in FIG. 16, in order to enhance the adhesion between the photoresist and the conductive layer 340 during the spray coating photoresist process, in some embodiments, an adhesive layer 360 is formed on the conductive layer 340 before spray coating the photo-resist layer 350 on the conductive layer 340. Then, the photo-resist layer 350 is spray coated, and the adhesive layer 360 is interposed between the photo-resist layer 350 and the conductive layer 340. The material and the thickness of the adhesive layer 360 could be determined without prejudice to the subsequent exposing, developing and etching process. The adhesive layer 360 assists the photo-resist layer 350 to favorably form a conformal film on the conductive layer 340, and a process margin of the subsequent exposing, developing and etching process could be increased. The conductive layer 140 is formed by, but not limited to spin coating. Spray coating process decreases the possibility of the cleaning fluid causing the defect on the conductive layer 340 during the pre-clean process, to prevent the broken lines formed on the redistribution metal from the conductive layer 340 and saves operating costs for manpower.

Figure 17:
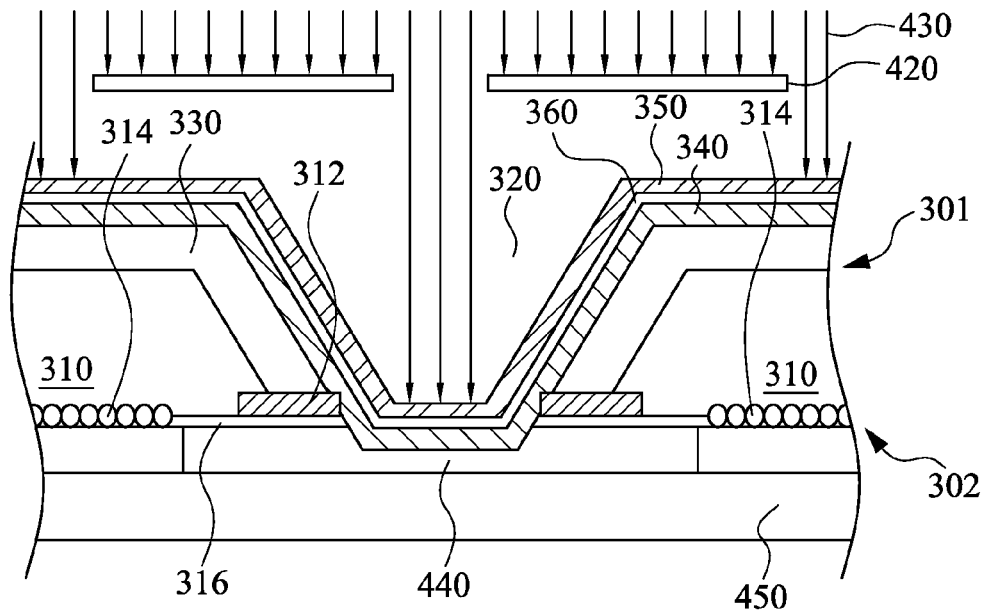
FIG. 17 is a cross-sectional view in a fifth stage of the method according to various embodiments of the present disclosure.
Figure 18:
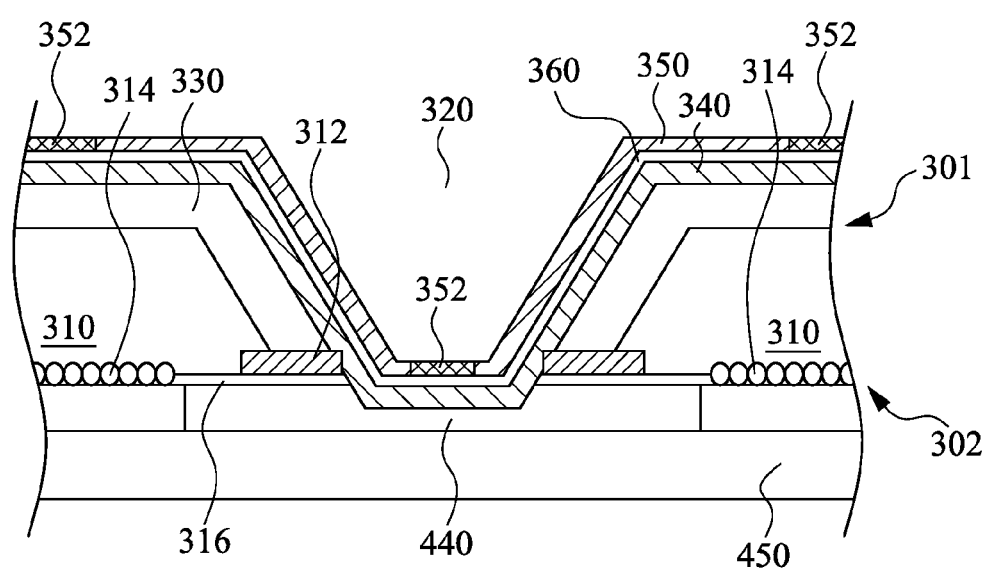
FIG. 18 is a cross-sectional view in a sixth stage of the method according to various embodiments of the present disclosure.
Figure 19:
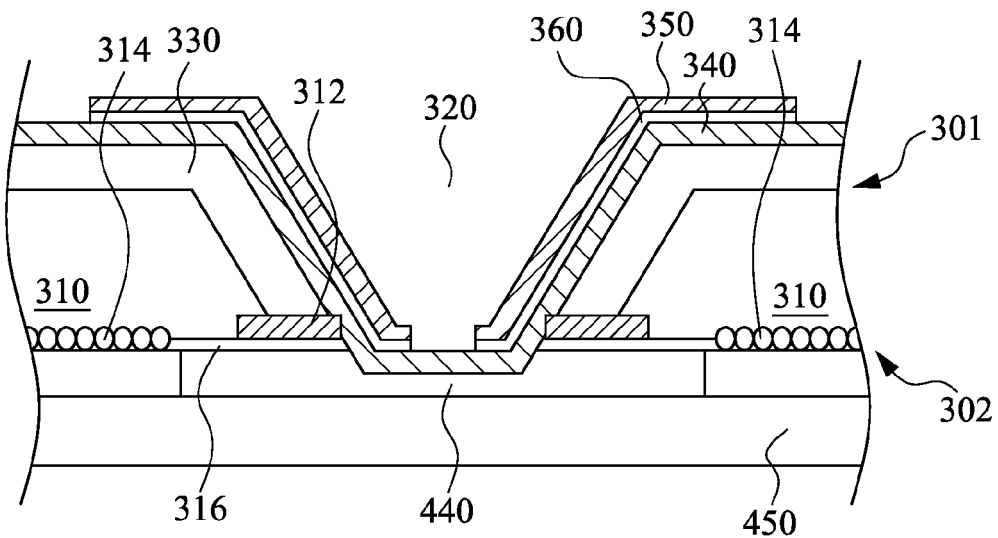
FIG. 19 is a cross-sectional view in a seventh stage of the method according to various embodiments of the present disclosure.

Please refer to FIG. 17-19, FIG. 17 is a cross-sectional view in a fifth stage of the fabricating method according to various embodiments of the present disclosure, FIG. 18 is a cross-sectional view in a sixth stage of the fabricating method according to various embodiments of the present disclosure, and FIG. 19 is a cross-sectional view in a seventh stage of the fabricating method according to various embodiments of the present disclosure. After spray coating the photo-resist layer 350 on the conductive layer 340, the photo-resist layer 350 is exposed. As shown in FIG. 17, the way of exposing the photo-resist layer 350, such as applying a specific patterned mask 420 and ultraviolet light 420 with appropriate wavelength to expose the photo-resist layer 350. It is worth noting that, the photo-resist layer 350 in various embodiments of the present disclosure is a positive type resist. As shown in FIG. 18, a part of the photo-resist layer 150 is exposed and transfers to an exposed photo-resist 152. Continuing in FIG. 19, the exposed photo-resist 152 will be washed away in the subsequent developing process, remaining another unexposed part of the photo-resist layer 350. In other words, the developed photo-resist layer 350 exposes at least a part of the conductive layer 340. More specifically, the specific pattern formed by the mask 420 shielding the ultraviolet light 430 would become the other unexposed part of the photo-resist layer 350 and remain thereafter. It is worth mentioning that, in the exposing and developing step, the photo-resist layer 350 in the recess 320 is exposed and developed to expose the conductive layer 340 between the two chips 310, and the exposed conductive layer 340 between the two chips 110 may be further etched to cut the conduction path between the two chips 310. On the other hand, when a negative type resist material is used as the photo-resist layer 350, the photo-resist layer 350 in the recess 320 needs to be shielded by a mask and is not exposed, and can only be washed away in the subsequent development process. However, in actual operation, the exposure scattered ultraviolet light from the higher grounds on both sides of the recess 320 will incident into the recess 320, causing the negative type resist material in the recess 320 to be exposed and remain behind, resulting in the subsequent etching process may not clean the conductive layer 340 between the two adjacent chips 310 thoroughly, Therefore, metal residues will remain on the outer surfaces of each chip, and water vapor may subsequently infiltrate into the metal conductive lines in the chip and cause corrosion and other problems. In contrast to embodiments of the present disclosure, the positive type resist is applied as the photo-resist layer 350, the photo-resist layer 350 in the recess 320 is the region scheduled to undergo exposure and washed away in the subsequent developing process, this directly avoids the problems that may occur when using a negative type resist. In embodiments, a part of the photo-resist layer 350 on the isolation layer 330 is also exposed, developed and removed to expose the conductive layer 340 under the removed photo-resist layer 350. Different redistribution layers could be formed in the subsequent etching process.

Figure 20:
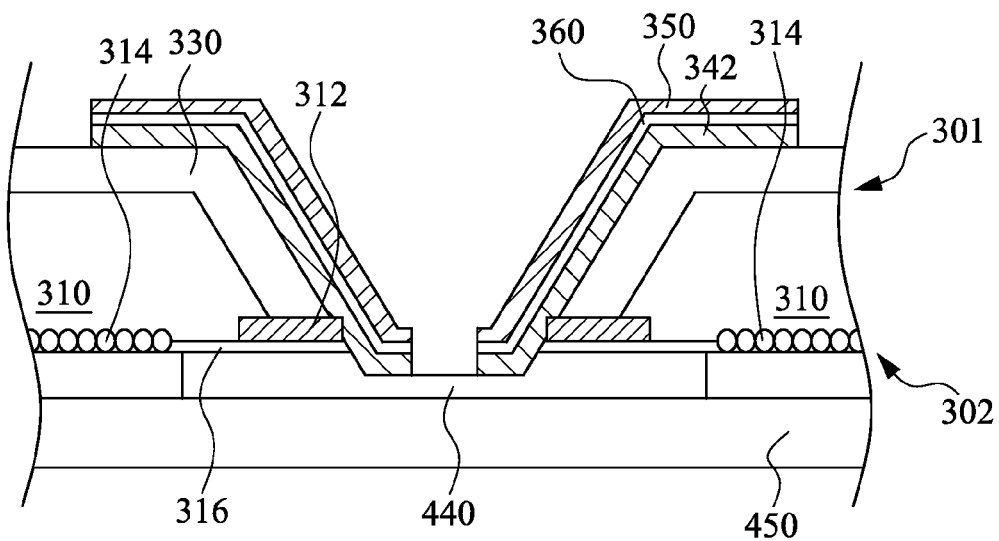
FIG. 20 is a cross-sectional view in an eighth stage of the method according to various embodiments of the present disclosure.

Please refer to FIG. 20, FIG. 20 is a cross-sectional view in an eighth stage of the fabricating method according to various embodiments of the present disclosure. After a part of the conductive layer 340 is exposed by exposing and developing a part of the photo-resist layer 350, the conductive layer 340 is etched to form a redistribution layer 342. The etching method could be, for example, a dry etching, but not limited thereto. Accordingly, the other part of the conductive layer 340 that is shielded by the other part of the photo-resist layer 350 left behind is not etched, and the redistribution layer 342 for each chip 310 is formed. The redistribution layer 342 is used as the electrical connection between the electronic components 314 in the chip 300 and the conductive pad 312 around the chip 300.

Figure 21:
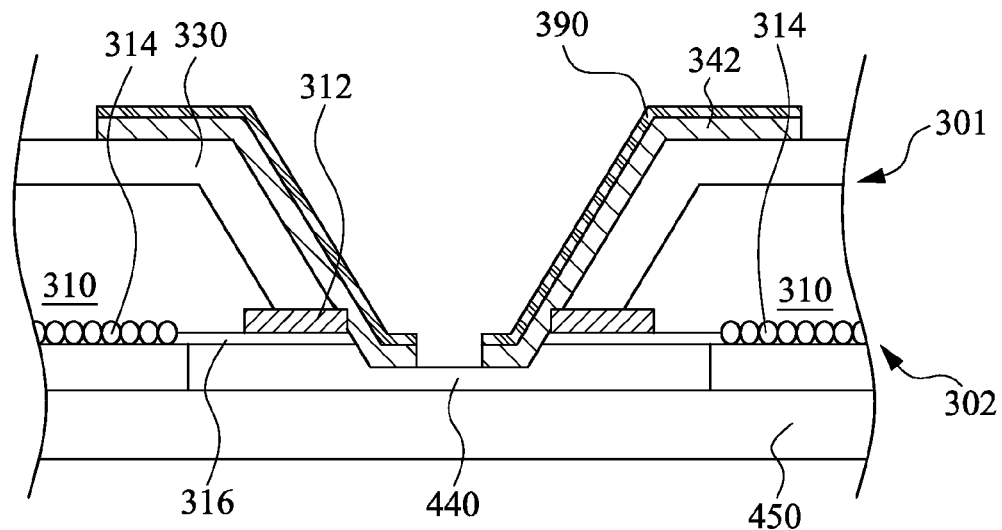
FIG. 21 is a cross-sectional view in a ninth stage of the method according to various embodiments of the present disclosure.

Please refer to FIG. 21, FIG. 21 is a cross-sectional view in a ninth stage of the fabricating method according to various embodiments of the present disclosure. After etching a part of the conductive layer 340 to form the redistribution layer 342, the photo-resist layer 350 is stripped. The method of stripping the photo-resist layer 350 could be appropriately adjusted for different photoresist materials. In embodiments, the method of stripping the photo-resist layer 350 is by spin coating a solvent for the photo-resist layer 350 onto the photo-resist layer 350 to dissolve and clean the photo-resist layer 350. In other words, spin coating the solvent for the photo-resist layer 350 onto the photo-resist layer 350 to dissolve the photo-resist layer 350 in the solvent, and then use processes such as rotating centrifugal drying or air knife to clean the dissolved photo-resist. The solvent could be any solvent which dissolves the photo-resist layer 350, or both the photo-resist layer 350 and the adhesion layer 360, but not dissolve the conductive layer 340, for example, but not limited thereto, acetone. As shown in FIG. 21, in embodiments, after stripping the photo-resist layer 350, the method further includes forming an interfacial layer 390 on the conductive layer 340. The interfacial layer 390 is interposed between the subsequently formed solder balls and a part of the redistribution layer 342 to act as an intermediate bonding layer to strengthen the bonding strength between the subsequently formed solder balls and the redistribution layer 342. The interfacial layer 390 could be any suitable conducting material, such as nickel, which is fully deposited onto a conductive layer 340 by sputtering. And then, a desired pattern is formed by lithography, the method is however not limited thereto.

Figure 22:
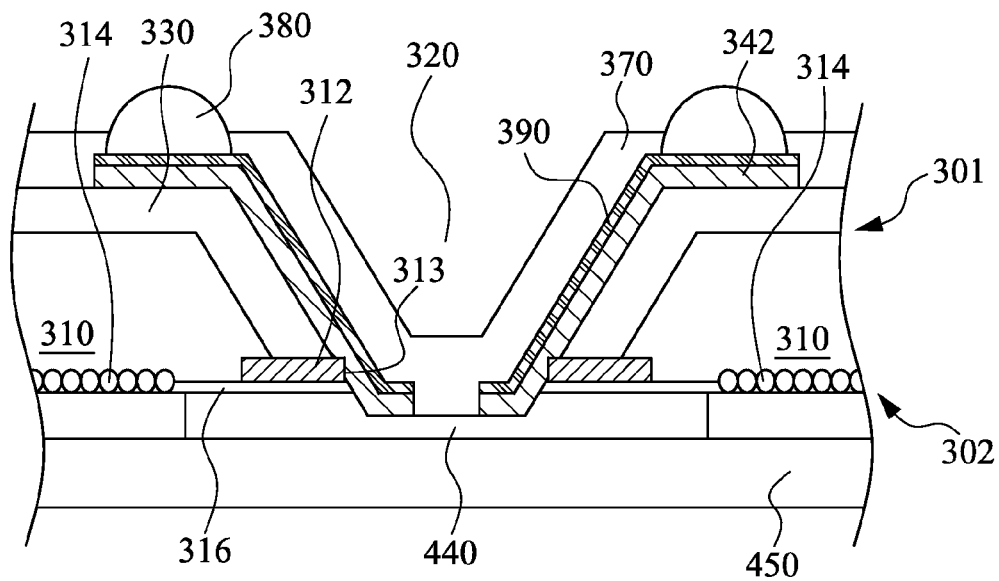
FIG. 22 is a cross-sectional view in a tenth stage of the method according to various embodiments of the present disclosure.

Please refer to FIG. 22, FIG. 22 is a cross-sectional view in a tenth stage of the fabricating method according to various embodiments of the present disclosure. After stripping the photo-resist layer 350, a solder layer 370 is formed fully over the isolation layer 330 and the redistribution layer 342 to cover and protect the redistribution layer 342 formed on the chip 310. The solder layer 370, for example, may be formed by brush coating a solder mask onto the surface of the isolation layer 330 and the redistribution layer 342, but are not limited thereto. Thereafter, solder lines are wire-bonded or solder balls are formed on the conducting pad 312 to further connect the printed circuit board, and thus the chip 310 transmits input or output signals through the solder lines or solder balls between the printed circuit boards and the conducting pad 312. The wire-bonded solder lines or solder balls are also connected to other semiconductor chips or other semiconductor interposers, and the chip 310 will integrate with other semiconductor chips or other semiconductor interposers to form a 3D-IC stacking structure. In embodiments, the method further includes forming a solder ball 380 on the redistribution layer 342, which the redistribution layer 342 is in contact and electrically connected to the sidewall 313 of the conducting pad 312. In some embodiments, at least a part of the interfacial layer 390 is interposed between the solder ball 380 and a part of the redistribution layer 342. The interfacial layer 390 is applied to strengthen the bonding strength between the solder ball 380 and the redistribution layer 342, and the reliability of the chip package could be enhanced. In embodiments, a scribe line (not shown) is between the two adjacent chips 310. For example, the scribe line is positioned at the region of the recess 310 having no redistribution layer 342. During splitting the chips 310, only the two adjacent chips 310 are split, and the carrier substrate 450 is not split, so that each split chip 310 will still be temporary arranged on the same carrier substrate 450 after packaging to allow ease of transporting. The scribe line could also split through the carrier substrate 450, and each split chip 310 is arranged on a part of the carrier substrate 450 after packaging to provide a protection for the internal components.

Figure 23:
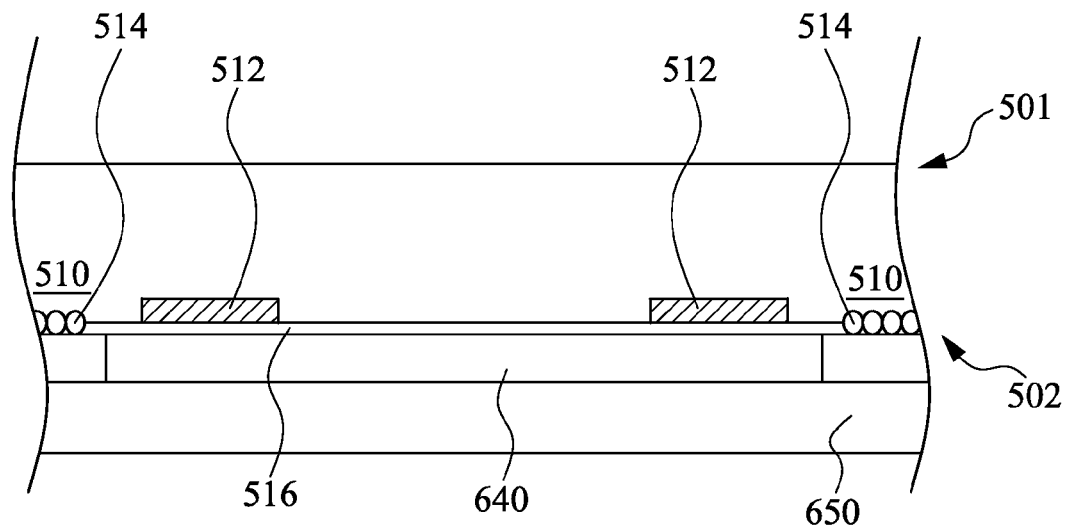
FIG. 23 is a cross-sectional view in a first stage of the method according to various embodiments of the present disclosure.

FIGS. 23-32 are cross-sectional views of different stages of the fabricating method according to various embodiments of the present disclosure. The major difference is, different recesses and isolation layers are formed in FIGS. 1-12 and FIGS. 23-32, respectively. Please refer to FIG. 23, FIG. 13 is a cross-sectional view in a first stage of the fabricating method according to various embodiments of the present disclosure. First, a wafer 500 is provided including at least two adjacent chips 510, and the wafer 500 has an upper surface 501 and a lower surface 502. At least one side of each chip 510 includes a conducting pad 512 on the lower surface 502. The wafer 500 could include, but not limited to silicon, germanium, or other III-V group elements. In embodiments, the conducting pad 512 could be connected to a solder ball or a wire-bonding after packaging each chip 510. The conducting pad 502 may be formed of aluminum, copper, nickel, or other suitable metal materials. The chip 510 further includes an electronic component 514 and an interconnection structure (not shown) electrically connected to the electronic component 514. The electronic component 514 could include, but not limited to active elements, passive elements, electronic components of integrated circuits, such as digital circuits or analog circuits, opto electronic devices, micro electro mechanical systems (MEMS), micro fluidic systems, physical sensors of measuring physical quantity variation, such as heat, light and pressure, RF circuits, accelerators, gyroscopes, micro actuators, surface acoustic wave (SAW) device, pressure sensors. Further, the wafer 500 includes a passivation layer 516, a support body 640 and a carrier substrate 650 under the lower surface 502 of the wafer 500. The passivation layer 516 is capable of isolating the air and providing stress-buffering to protect every components in the chip 510. The passivation layer 516 could be, but not limited to silicon oxide, silicon nitride, silicon oxynitride, or other suitable isolation materials. The carrier substrate 650 is disposed under the under surface 502 of the wafer 500 by the support body 640, and thus a cavity is formed under each chip 510 to provide protection to every components in the chip 510. Also, the carrier substrate 650 provides the wafer 500 carrying capacity required in subsequent process.

Figure 24:
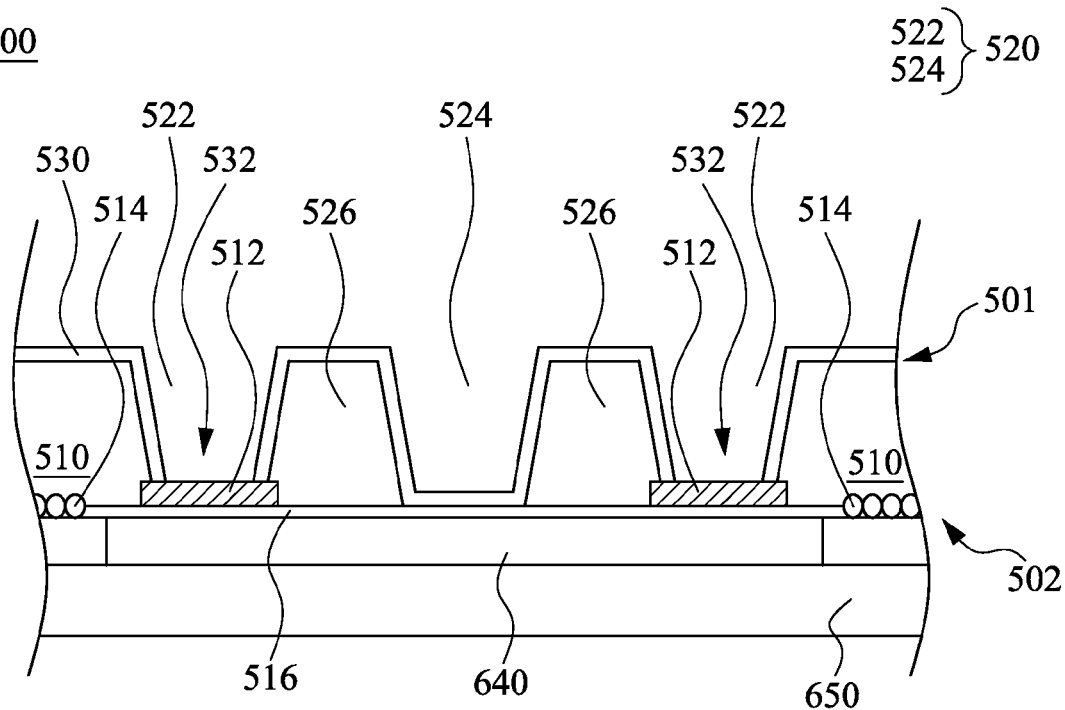
FIG. 24 is a cross-sectional view in a second stage of the method according to various embodiments of the present disclosure.

Please refer to FIG. 24, FIG. 24 is a cross-sectional view in a second stage of the fabricating method according to various embodiments of the present disclosure. A recess 520 extending from the upper surface 501 to the lower surface 502 is formed to expose the conducting pad 512. The recess 520 is formed between the two adjacent chips 510 and acts as the pre-cutting of the two adjacent chips 510. The recess 520 includes two conducting recesses 522 and a scribe recess 524 between the two conducting recesses 522. A barrier 526 separates the scribe recess 524 from the conducting recesses 522. A scribe line (not shown) is positioned in the scribe recess 524, and the chips 510 could be split along the scribe line in the scribe recess 524 in the subsequent process. The barrier 526 protects the conducting pad 512 from defect or liquid corrosion. The recess 320 is formed by, but not limited to photolithography. In embodiments, the two conducting recesses 522 and the scribe recess 524 are formed in a same photolithography process, remaining the barrier 526 between the two conducting recesses 522 and the scribe recess 524. As aforementioned, the conducting pad 512 could be connected to a solder ball or a wire-bonding after packaging each chip 510. Therefore, an end point of etching the wafer 500 for forming the recess 520 could be set to respectively expose the conducting pads 512 of the two adjacent chips 510. Continuing in FIG. 24, an isolation layer 530 extending from the upper surface 501 to the lower surface 502, and a part of the isolation layer 530 is disposed in the recess 520. The isolation layer 530 has two openings 532 to expose the conducting pad 512, and a surface of the scribe recess 524 is covered by the isolation layer 530. The isolation layer 530 could be silicon oxide, silicon nitride, silicon oxynitride, or other suitable isolation materials. A chemical vapor deposition (CVD) is applied to form the isolation layer 530 conformally along the upper surface 501 of the wafer 500, the sidewall of the conductive recess 522 and the scribe recess 524.

Figure 25:
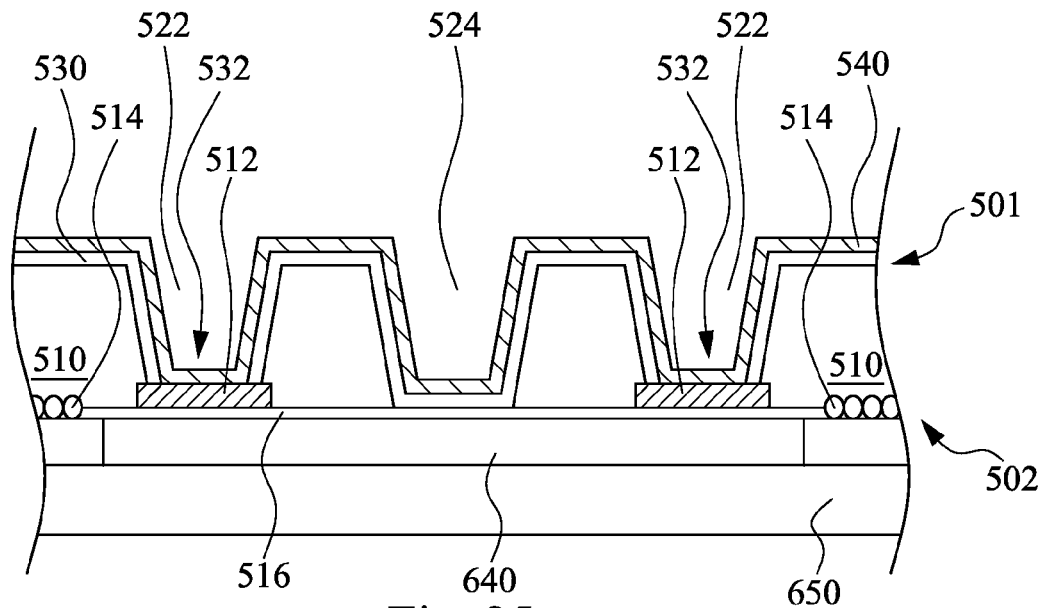
FIG. 25 is a cross-sectional view in a third stage of the method according to various embodiments of the present disclosure.

Continuing to FIG. 25, FIG. 25 is a cross-sectional view in a third stage of the fabricating method according to various embodiments of the present disclosure. A conductive layer 540 is formed on the isolation layer 530 and the conductive pad 512. The conducting layer 540 may be formed of aluminum, copper, nickel, or other suitable metal materials, using sputtering, evaporation, or other suitable process to deposit the conductive layer 540 on the semiconductor wafer. In embodiments, the conductive layer 540 is formed of aluminum.

Figure 26:
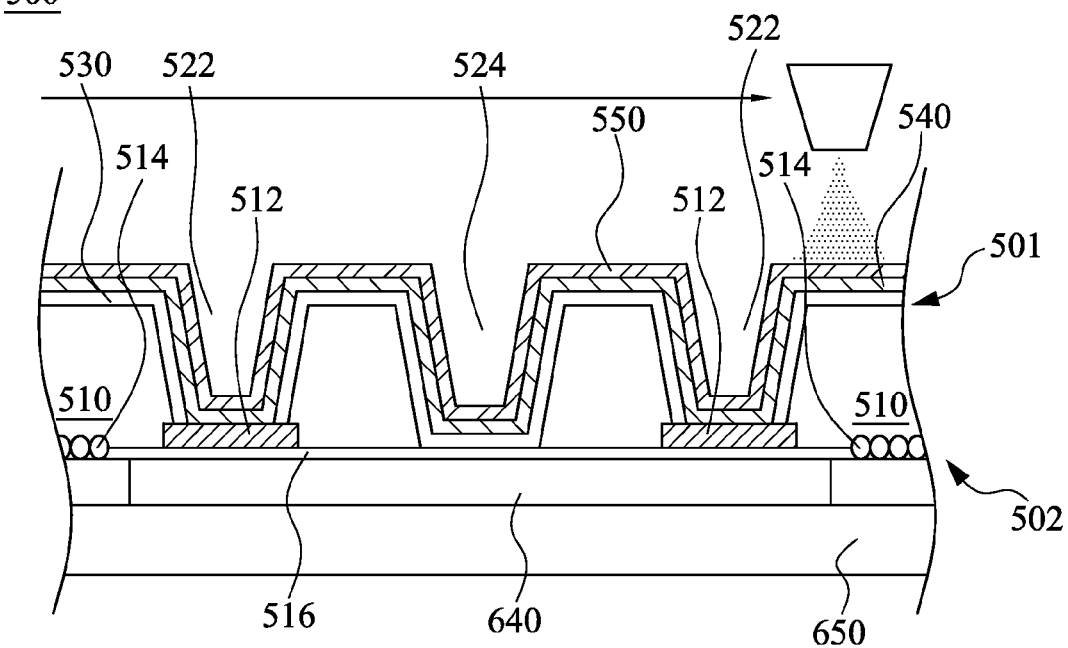
FIG. 26 is a cross-sectional view in a fourth stage of the method according to various embodiments of the present disclosure.

Please refer to FIG. 26, FIG. 26 is a cross-sectional view in a fourth stage of the fabricating method according to various embodiments of the present disclosure. A photo-resist layer 550 is spray coated on the conductive layer 540. The way of spray coating the photo-resist layer 550 on the conductive layer 540 is shown in FIG. 26, a nozzle 610 is applied to evenly spray the photoresist on the upper surface 501 of the wafer 500, and the photo-resist layer 550 having uniform thickness is formed. In embodiments, in order to enhance the adhesion between the photoresist and the conductive layer 540 during the spray coating photoresist process, an adhesive layer (not shown) is formed on the conductive layer 540 before spray coating the photo-resist layer 550 on the conductive layer 540. Then, the photo-resist layer 550 is spray coated, and the adhesive layer is interposed between the photo-resist layer 550 and the conductive layer 540. The material and the thickness of the adhesive layer could be determined without prejudice to the subsequent exposing, developing and etching process. The adhesive layer assists the photo-resist layer 550 to favorably form a conformal film on the conductive layer 540, and a process margin of the subsequent exposing, developing and etching process could be increased. The conductive layer 540 is formed by, but not limited to spin coating. Spray coating process decreases the possibility of the cleaning fluid causing the defect on the conductive layer 540 during the pre-clean process, to prevent the broken lines formed on the redistribution metal from the conductive layer 540 and saves operating costs for manpower.

Figure 27:
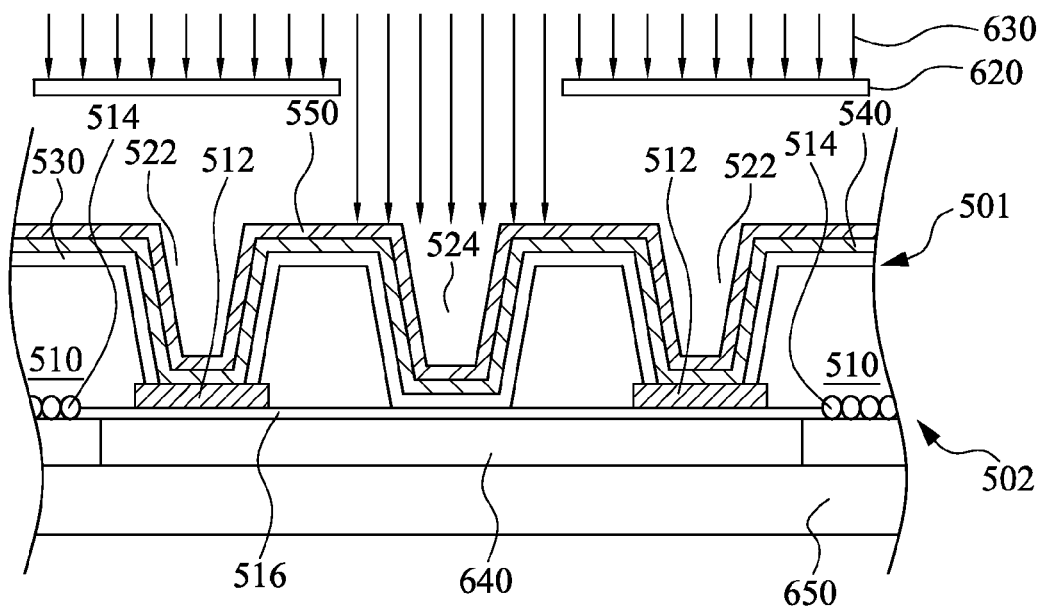
FIG. 27 is a cross-sectional view in a fifth stage of the method according to various embodiments of the present disclosure.
Figure 28:
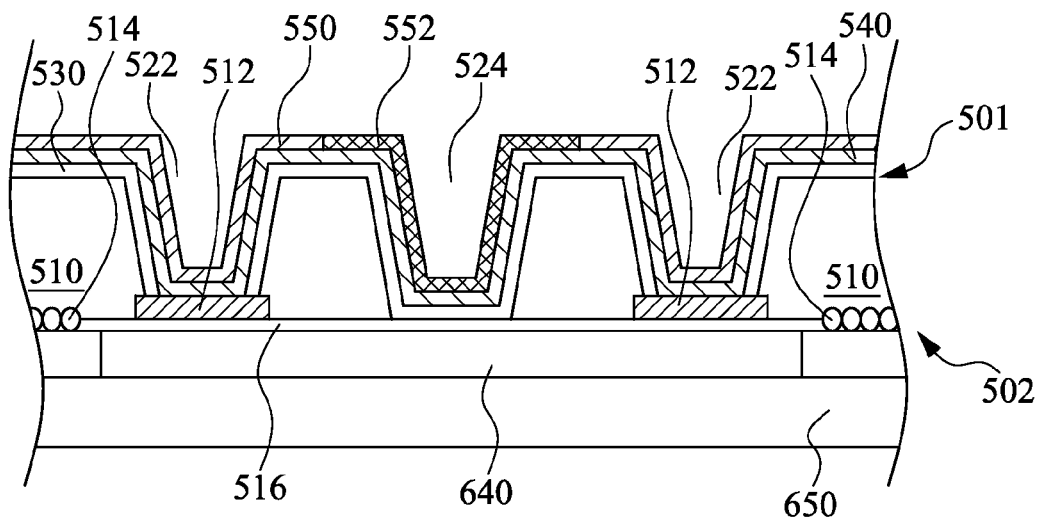
FIG. 28 is a cross-sectional view in a sixth stage of the method according to various embodiments of the present disclosure.
Figure 29:
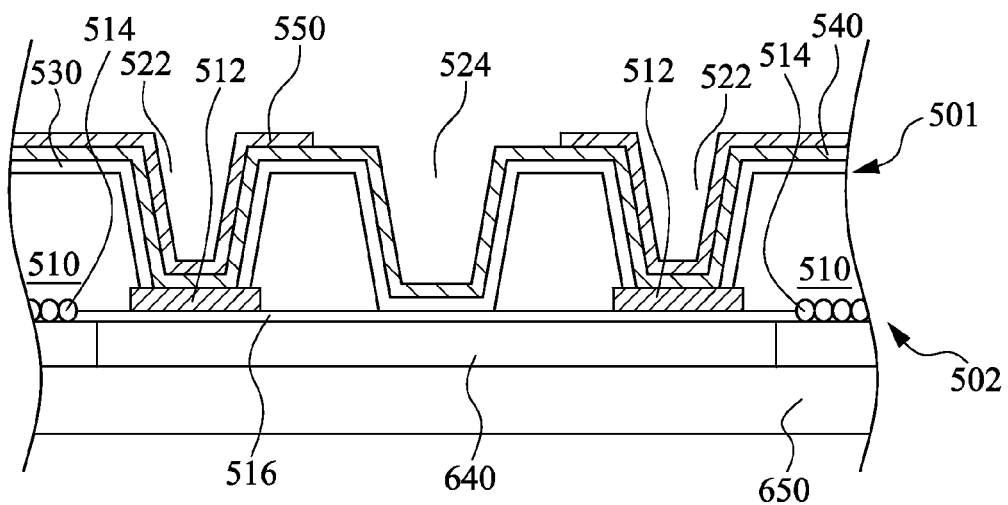
FIG. 29 is a cross-sectional view in a seventh stage of the method according to various embodiments of the present disclosure.

Please refer to FIG. 27-29, FIG. 27 is a cross-sectional view in a fifth stage of the fabricating method according to various embodiments of the present disclosure, FIG. 28 is a cross-sectional view in a sixth stage of the fabricating method according to various embodiments of the present disclosure, and FIG. 29 is a cross-sectional view in a seventh stage of the fabricating method according to various embodiments of the present disclosure. After spray coating the photo-resist layer 550 on the conductive layer 540, the photo-resist layer 550 is exposed. As shown in FIG. 27, the way of exposing the photo-resist layer 550, such as applying a specific patterned mask 620 and ultraviolet light 620 with appropriate wavelength to expose the photo-resist layer 550. It is worth noting that, the photo-resist layer 550 in various embodiments of the present disclosure is a positive type resist. As shown in FIG. 28, a part of the photo-resist layer 550 is exposed and transfers to an exposed photo-resist 552. Continuing in FIG. 29, the exposed photo-resist 552 will be washed away in the subsequent developing process, remaining another exposed part of the photo-resist layer 550. In other words, the developed photo-resist layer 550 exposes at least a part of the conductive layer 540. More specifically, the specific pattern formed by the mask 620 shielding the ultraviolet light 630 would become the other unexposed part of the photo-resist layer 550 and remain thereafter. It is worth mentioning that, in the exposing and developing step, the photo-resist layer 550 in the scribe recess 524 is exposed and developed to expose the conductive layer 540 between the two chips 510, and the exposed conductive layer 540 between the two chips 510 may be further etched to cut the conduction path between the two chips 510. In embodiments, the photo-resist layer 550 is a negative type resist, and the part shielded by the mask 620 is contrary to FIG. 27.

Figure 30:
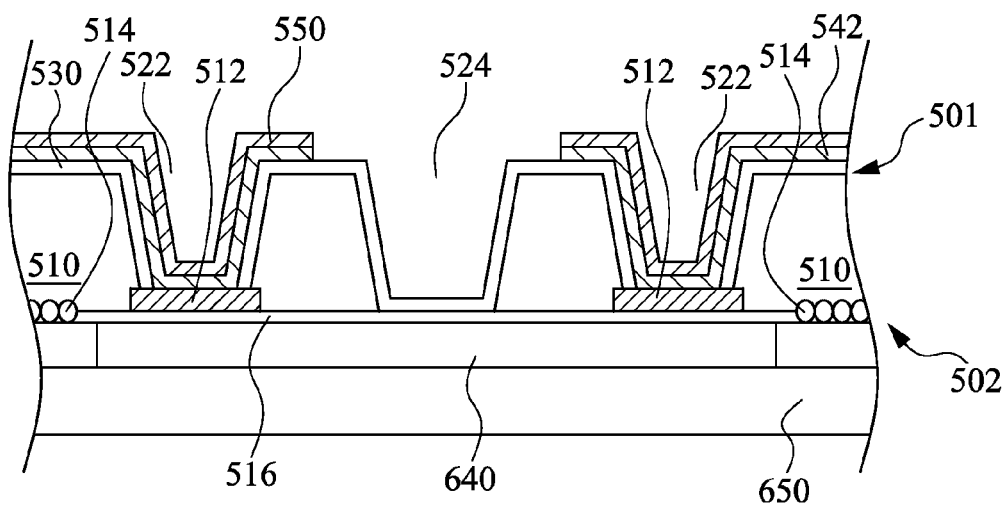
FIG. 30 is a cross-sectional view in an eighth stage of the method according to various embodiments of the present disclosure.

Please refer to FIG. 30, FIG. 30 is a cross-sectional view in an eighth stage of the fabricating method according to various embodiments of the present disclosure. After a part of the conductive layer 540 is exposed by exposing and developing a part of the photo-resist layer 550, the conductive layer 540 is etched to form a redistribution layer 542. The etching method could be, for example, a dry etching, but not limited thereto. Accordingly, the other part of the conductive layer 540 that is shielded by the other part of the photo-resist layer 550 left behind is not etched, and the redistribution layer 542 for each chip 510 is formed. The redistribution layer 542 is used as the electrical connection between the electronic components 514 in the chip 500 and the conducting pad 512 around the chip 500. In embodiments, the conductive layer 540 in the scribe recess 524 is etched to cut the conduction path between the two chips 510.

Figure 31:
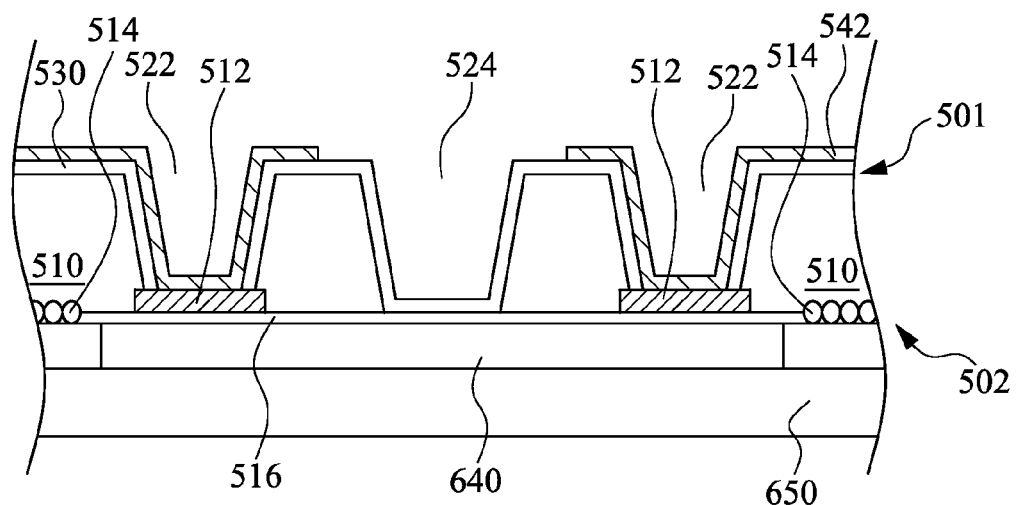
FIG. 31 is a cross-sectional view in a ninth stage of the method according to various embodiments of the present disclosure.

Please refer to FIG. 31, FIG. 31 is a cross-sectional view in a ninth stage of the fabricating method according to various embodiments of the present disclosure. After etching a part of the conductive layer 540 to form the redistribution layer 542, the photo-resist layer 550 is stripped. The method of stripping the photo-resist layer 550 could be appropriately adjusted for different photoresist materials. In embodiments, the method of stripping the photo-resist layer 550 is by spin coating a solvent for the photo-resist layer 550 onto the photo-resist layer 550 to dissolve and clean the photo-resist layer 550. In other words, spin coating the solvent for the photo-resist layer 550 onto the photo-resist layer 550 to dissolve the photoresist layer 550 in the solvent, and then use processes such as rotating centrifugal drying or air knife to clean the dissolved photo-resist. The solvent could be any solvent which dissolves the photo-resist layer 550, or both the photo-resist layer 550 and the adhesion layer 560, but not dissolve the conductive layer 540, for example, but not limited thereto, acetone. As shown in FIG. 31, in embodiments, after stripping the photo-resist layer 550, the method further includes forming an interfacial layer (not shown) on the conductive layer 540. The interfacial layer is interposed between the subsequently formed solder balls and a part of the redistribution layer 542 to act as an intermediate bonding layer to strengthen the bonding strength between the subsequently formed solder balls and the redistribution layer 542. The interfacial layer 390 could be any suitable conducting material, such as nickel, which is fully deposited onto a conductive layer 540 by sputtering. And then, a desired pattern is formed by lithography, the method is however not limited thereto.

Figure 32:
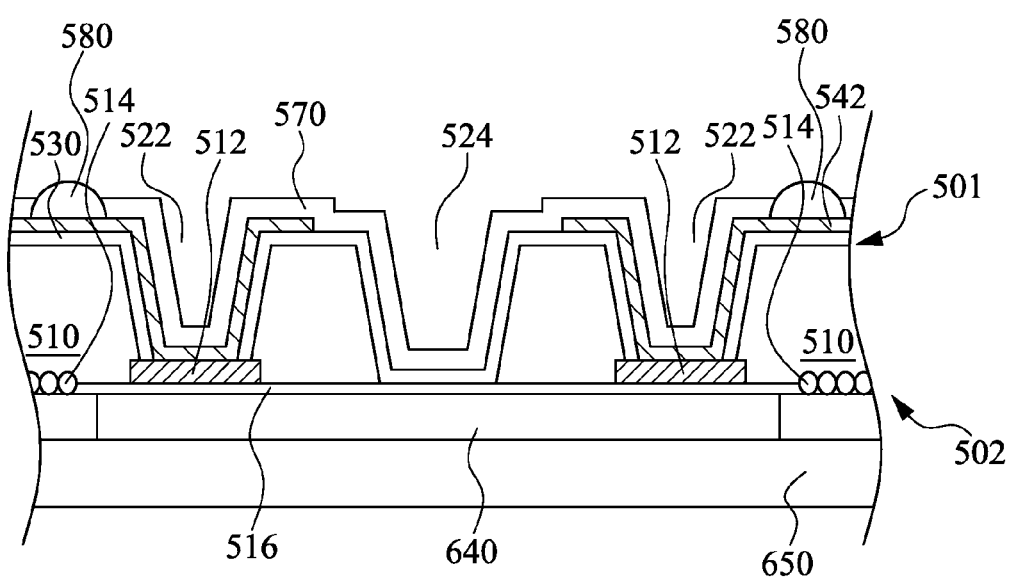
FIG. 32 is a cross-sectional view in a tenth stage of the method according to various embodiments of the present disclosure.

Please refer to FIG. 32, FIG. 32 is a cross-sectional view in a tenth stage of the fabricating method according to various embodiments of the present disclosure. After stripping the photo-resist layer 550, a solder layer 570 is formed fully over the isolation layer 530 and the redistribution layer 542 to cover and protect the redistribution layer 542 formed on the chip 510. The solder layer 570, for example, may be formed by brush coating a solder mask onto the surface of the isolation layer 530 and the redistribution layer 542, but are not limited thereto. Thereafter, solder lines are wire-bonded or solder balls are formed on the conducting pad 512 to further connect the printed circuit board, and thus the chip 510 transmits input or output signals through the solder lines or solder balls between printed circuit boards and the conducting pad 512. The wire-bonded solder lines or solder balls are also connected to other semiconductor chips or other semiconductor interposers, and the chip 510 will integrate with other semiconductor chips or other semiconductor interposers to form a 3D-IC stacking structure. In embodiments, the method further includes forming a solder ball 580 on the redistribution layer 542. In some embodiments, at least a part of the interfacial layer is interposed between the solder ball 580 and a part of the redistribution layer 542. The interfacial layer is applied to strengthen the bonding strength between the solder ball 580 and the redistribution layer 542, and the reliability of the chip package could be enhanced. In embodiments, a scribe line (not shown) is between the two adjacent chips 510. For example, the scribe line is positioned in the scribe recess 524. During splitting the chips 510, only the two adjacent chips 510 are split, and the carrier substrate 650 is not split, so that each split chip 510 will still be temporary arranged on the same carrier substrate 650 after packaging to allow ease of transporting. The scribe line could also split through the carrier substrate 650, and each split chip 510 is arranged on a part of the carrier substrate 650 after packaging to provide a protection for the internal components.

Finally, it is worth emphasizing that, the present disclosure provides the method of fabricating the wafer-level chip packaging. The method effectively prevents the concerns of residual metals formed between the chip packages during the process, and thus enhances the reliability of the each chip package. At the same time, the method of fabricating the wafer-level chip packaging provided by the present disclosure has simpler steps than the traditional method, thereby saving the manpower and the manufacturing cost of the chip package.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:

1. A method of fabricating a wafer-level chip package, comprising:
   providing a wafer with at least two adjacent chips, the wafer having an upper surface and a lower surface, and at least one side of each chip includes a conducting pad on the lower surface;
   forming a recess extending from the upper surface to the lower surface to expose the conducting pad;
   forming an isolation layer extending from the upper surface to the lower surface, a part of the isolation layer disposed in the recess, wherein the isolation layer has an opening to expose the conducting pad;
   forming a conductive layer on the isolation layer and the conductive pad;
   spray coating a photo-resist layer on the conductive layer;
   exposing and developing the photo-resist layer to expose a part of the conductive layer;
   etching the part of the conductive layer to form a redistribution layer;
   stripping the photo-resist layer; and
   forming a solder layer on the isolation layer and the redistribution layer.

2. The method of fabricating a wafer-level chip package in claim 1, before spray coating a photo-resist layer on the conductive layer, further comprising forming an adhesive layer on the conductive layer.

3. The method of fabricating a wafer-level chip package in claim 2, wherein the adhesive layer is formed by spin coating.

4. The method of fabricating a wafer-level chip package in claim 1, further comprising forming a solder ball on the conducting pad, wherein a part of the redistribution layer is interposed between the solder ball and the conducting pad.

5. The method of fabricating a wafer-level chip package in claim 4, wherein the solder ball is formed of tin.

6. The method of fabricating a wafer-level chip package in claim 5, after stripping the photo-resist layer, further comprising:
   forming an interfacial layer on the part of the redistribution layer, wherein a part of the interfacial layer is interposed between the solder ball and the part of the redistribution layer.

7. The method of fabricating a wafer-level chip package in claim 6, wherein the conductive layer and the interfacial layer are formed by sputtering.

8. The method of fabricating a wafer-level chip package in claim 6, wherein the interfacial layer is formed of nickel.

9. The method of fabricating a wafer-level chip package in claim 1, wherein the conductive layer is formed of aluminum.

10. The method of fabricating a wafer-level chip package in claim 1, wherein stripping the photo-resist layer is by spin coating a solvent for the photo-resist layer on the photo-resist layer to dissolve and remove the photo-resist layer.

11. The method of fabricating a wafer-level chip package in claim 10, wherein the solvent is acetone.

12. The method of fabricating a wafer-level chip package in claim 1, further comprising cutting at least the two adjacent chips along a scribe line, wherein the scribe line is between at least the two adjacent chips.

13. The method of fabricating a wafer-level chip package in claim 1, wherein the photo-resist layer is a positive type resist.

14. The method of fabricating a wafer-level chip package in claim 1, wherein the isolation layer has two openings.

15. The method of fabricating a wafer-level chip package in claim 1, wherein during forming the recess extending from the upper surface to the lower surface, a lower surface of the recess is formed lower than a sidewall of the conducting pad.

16. The method of fabricating a wafer-level chip package in claim 15, wherein during forming the recess extending from the upper surface to the lower surface, the isolation layer covers an upper surface of the conducting pad to expose the sidewall of the conducting pad.

17. The method of fabricating a wafer-level chip package in claim 1, wherein forming the recess extending from the upper surface to the lower surface further comprises forming two conducting recesses and a scribe recess between the two conducting recesses, the conducting recesses exposing the conducting pad.

* * * * *